US011523527B2

(12) United States Patent
Chambliss et al.

(10) Patent No.: US 11,523,527 B2
(45) Date of Patent: Dec. 6, 2022

(54) GLASS-BASED ARTICLES HAVING CRACK RESISTANT STRESS PROFILES

(71) Applicant: CORNING INCORPORATED, Corning, NY (US)

(72) Inventors: Kameron Isaiah Chambliss, Corning, NY (US); Benedict Osobomen Egboiyi, Painted Post, NY (US); Kevin Barry Reiman, Horseheads, NY (US); Vitor Marino Schneider, Painted Post, NY (US)

(73) Assignee: CORNING INCORPORATED, Corning, NY (US)

(*) Notice: Subject to any disclaimer, the term of this patent is extended or adjusted under 35 U.S.C. 154(b) by 1105 days.

(21) Appl. No.: 16/146,214

(22) Filed: Sep. 28, 2018

(65) Prior Publication Data

US 2019/0104627 A1  Apr. 4, 2019

Related U.S. Application Data

(60) Provisional application No. 62/567,461, filed on Oct. 3, 2017.

(51) Int. Cl.
*B32B 15/04* (2006.01)
*B32B 17/06* (2006.01)
(Continued)

(52) U.S. Cl.
CPC .............. *H05K 5/03* (2013.01); *C03B 27/012* (2013.01); *C03C 3/097* (2013.01); *C03C 4/18* (2013.01);
(Continued)

(58) Field of Classification Search
CPC .................................................... C03C 21/002
(Continued)

(56) References Cited

U.S. PATENT DOCUMENTS 3,433,611 A * 3/1969 Kubichan .............. C03C 3/097
501/63
8,854,623 B2  10/2014 Fontaine et al.
(Continued)

FOREIGN PATENT DOCUMENTS

CN        105753314 A    7/2016
JP     2001-302278 A    10/2001
(Continued)

OTHER PUBLICATIONS

International Search Report and Written Opinion PCT/US2018/053987 dated Jan. 18, 2019, 12 Pgs.
(Continued)

*Primary Examiner* — Lauren R Colgan
(74) *Attorney, Agent, or Firm* — Kevin M. Johnson; Kapil Banakar

(57) ABSTRACT

Glass-based articles are disclosed having a thickness in a range of from about 0.2 mm to about 4.0 mm, a first compressive stress layer extending from a first surface of the glass-based article to a first depth of compression that is in a range of from about 5% to about 20% of the thickness, a second compressive stress layer extending from a second surface of the glass-based article to a second depth of compression that is in a range of from about 5% to about 20% of the thickness, wherein the second surface is opposite the first surface, and a central region extending from the first depth of compression to the second depth of compression and having a maximum tensile stress in a range of from about 0.5 MPa to about 20 MPa. Electronic devices comprising the glass-based articles and methods of making glass-based articles are also disclosed.

30 Claims, 9 Drawing Sheets

(51) Int. Cl.
*H05K 5/03* (2006.01)
*C03C 3/097* (2006.01)
*C03C 4/18* (2006.01)
*C03B 27/012* (2006.01)
*H05K 5/00* (2006.01)
*C03C 21/00* (2006.01)
*C03C 23/00* (2006.01)
*C03C 3/083* (2006.01)

(52) U.S. Cl.
CPC .......... *C03C 21/002* (2013.01); *C03C 23/007* (2013.01); *H05K 5/0017* (2013.01); *H05K 5/0086* (2013.01); *C03C 3/083* (2013.01); *C03C 2204/00* (2013.01)

(58) Field of Classification Search
USPC ....................................................... 428/410
See application file for complete search history.

(56) References Cited

U.S. PATENT DOCUMENTS

| | | | |
|---|---|---|---|
| 8,951,927 B2 | 2/2015 | Dejneka et al. | |
| 9,593,042 B2 | 3/2017 | Hu et al. | |
| 9,604,876 B2 | 3/2017 | Gy et al. | |
| 9,801,297 B2 | 10/2017 | Amin et al. | |
| 9,896,374 B2 | 2/2018 | Akiba et al. | |
| 9,957,190 B2 | 5/2018 | Finkeldey et al. | |
| 2001/0049327 A1* | 12/2001 | Hachitani | C03C 21/002 501/64 |
| 2009/0220761 A1* | 9/2009 | Dejneka | C03C 21/002 501/67 |
| 2011/0045961 A1 | 2/2011 | Dejneka et al. | |
| 2013/0189486 A1* | 7/2013 | Wang | C03C 21/002 501/63 |
| 2015/0259244 A1* | 9/2015 | Amin | C03C 21/002 428/410 |
| 2016/0002103 A1* | 1/2016 | Wang | B32B 17/10 428/141 |
| 2016/0102011 A1* | 4/2016 | Hu | C03C 10/0027 428/155 |
| 2016/0122239 A1 | 5/2016 | Amin et al. | |
| 2016/0376186 A1 | 12/2016 | Gross | |
| 2017/0158556 A1 | 6/2017 | Dejneka et al. | |
| 2017/0166478 A1 | 6/2017 | Gross et al. | |
| 2017/0197876 A1 | 7/2017 | Oram et al. | |
| 2017/0247291 A1 | 8/2017 | Hatano et al. | |
| 2018/0079684 A1 | 3/2018 | Hatano et al. | |
| 2018/0105461 A1 | 4/2018 | Schneider | |

FOREIGN PATENT DOCUMENTS

| | | |
|---|---|---|
| JP | 2013-502370 A | 1/2013 |
| JP | 2013-520385 A | 6/2013 |
| JP | 2016-508954 A | 3/2016 |
| WO | 2013/088856 A1 | 6/2013 |
| WO | 2016/191676 A1 | 12/2016 |
| WO | 2017087432 A1 | 5/2017 |
| WO | 2018102172 A1 | 6/2018 |

OTHER PUBLICATIONS

Chinese Patent Application No. 201880064826.0, Office Action dated Mar. 14, 2022, 5 pages of English Translation, Chinese Patent Office.

Japanese Patent Application No. 2020-519115, Office Action, dated Jul. 20, 2022, 12 pages (6 pages of English Translation and 6 pages of Original Copy); Japanese Patent Office.

* cited by examiner

GLASS-BASED ARTICLES HAVING CRACK RESISTANT STRESS PROFILES

CROSS-REFERENCE TO RELATED APPLICATIONS

This application claims the benefit of priority of U.S. Provisional Application Ser. No. 62/567,461 filed on Oct. 3, 2017, the contents of which are relied upon and incorporated herein by reference in their entirety.

BACKGROUND

This disclosure relates to glass-based articles exhibiting crack resistant stress profiles.

Electronic devices, for example, handheld electronic devices such as mobile phones and tablets, include a cover substrate, which is typically made from glass and referred to as a cover glass. However, breakage of the cover glass of electronic devices is a persistent problem. The failure and breakage of cover glass can be attributed to flexural failure, caused by the bending of glass when the device is subjected to dynamic or static loading, as well as sharp contact failure, caused by damage introduction due to sharp indentation on the glass surface when the cover glass falls on a rough surface such as asphalt, concrete, etc.

Glass-based articles often experience severe impacts that can introduce large flaws into a surface of such articles. Such flaws can extend to depths of up to about 200 micrometers from the surface. There is a need for glass-based articles that exhibit improved properties, such as resistance to fracture due to dropping of the articles, particularly when subjected to sharp contact damage.

SUMMARY

A first aspect of this disclosure pertains to a strengthened glass-based article comprising a thickness in a range of from about 0.2 mm to about 4.0 mm, a first compressive stress layer extending from a first surface of the glass-based article to a first depth of compression (DOC1) that is in a range of from about 5% to about 20% of the thickness, a second compressive stress layer extending from a second surface of the glass-based article to a second depth of compression (DOC2) that is in a range of from about 5% to about 20% of the thickness, and a central region extending from the first depth of compression (DOC1) to the second depth of compression (DOC2) and having a maximum tensile stress in a range of from about 0.5 MPa to about 20 MPa.

Another aspect of this disclosure pertains to an electronic device such as a wearable electronic device comprising a glass-based article as described herein.

Another aspect of this disclosure pertains to a method of making a glass-based article as described herein.

Additional features and advantages will be set forth in the detailed description which follows, and in part will be readily apparent to those skilled in the art from that description or recognized by practicing the embodiments as described herein, including the detailed description which follows, the claims, as well as the appended drawings.

It is to be understood that both the foregoing general description and the following detailed description are merely exemplary, and are intended to provide an overview or framework for understanding the nature and character of the claims. The accompanying drawings are included to provide a further understanding, and are incorporated in and constitute a part of this specification. The drawings illustrate one or more embodiment(s), and together with the description serve to explain principles and operation of the various embodiments.

DETAILED DESCRIPTION

Figure 1:
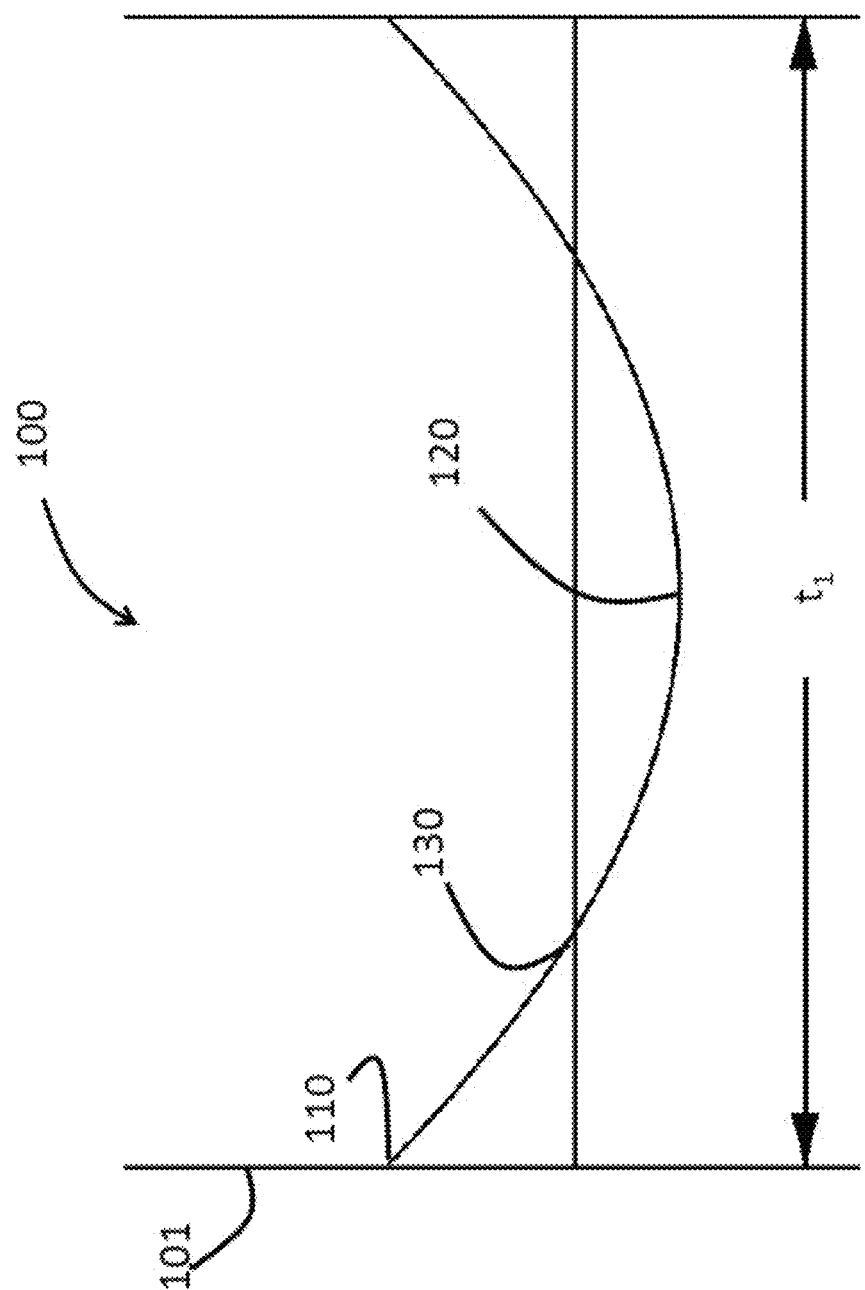
FIG. 1 is a cross-sectional representation of a stress profile across a thickness of a strengthened glass-based article.

Before describing several exemplary embodiments, it is to be understood that the disclosure is not limited to the details of construction or process steps set forth in the following disclosure. The disclosure provided herein is capable of other embodiments and of being practiced or being carried out in various ways.

Embodiments of the disclosure provide strengthened glass-based articles that are resistant to crack propagation when subjected to sharp contact damage. The strengthened glass-based articles can be used as a cover in a variety of electronic devices. The electronic devices can be mobile, portable and in some cases handheld. As used herein, "handheld device" refers to a portable electronic device that has a display screen. Non-limiting examples of such electronic devices include a mobile telephone, an electronic reading device, a music playback device, and a navigation device. In one or more embodiments, the strengthened glass-based articles described herein can also be used to cover displays or for other purposes in electronic devices including, but not limited to, relatively larger form factor electronic devices (e.g., portable computers, tablet computers, displays, monitors, televisions, etc.). The strengthened glass-based articles described herein may be a part of a wearable consumer electronic device, such as a watch, a media player, a wallet and a bracelet. Such wearable devices are configured to be worn by an individual, for example, by attaching the wearable device to an individual's arm, leg, hand, etc. by a strap or other suitable attachment mechanism.

In use, wearable devices experience little to no applied bending stress (30 MPa or less), yet damage introduction events on such devices have been observed to produce deep (>100 microns) flaws. In such cases, the source of tension to propagate the damage to the point of fracture has been observed to be only the central tension (CT). The unique stress profiles for glass-based articles described herein provide resistance to fracture, leading to increased reliability and survival.

The glass-based articles, such as a cover glass of a mobile electronic device, described herein exhibit increased survivability. In one or more embodiments, glass-based articles have damage resistance through a deep depth of compression (DOC). In some embodiments, once a target DOC is achieved (e.g., in a range of from about 5% to about 20% of thickness of the article), ion exchange or thermal tempering can be performed on the article until the magnitude of central tension (CT) is decreased to a maximum in a range of from about 0.5 MPa to about 20 MPa. Experiments have shown that a "through crack" (a crack extending through the entire thickness of the glass article) can be introduced into a glass having a CT=10 MPa, and the crack will not propagate further (in air or in water when aged for over 1 year). In one or more embodiments, a surface compressive stress in a range of from 150 MPa to 800 MPa is provided to retain surface strength (as measured by ring-on-ring testing (ROR)) and edge strength (measured by four point bend test). In one or more embodiments, the stress profiles can be achieved either in a mixed bath ion exchange (e.g., containing sodium and potassium) or in a two-step process including thermal or ion exchange tempering as a first step followed by an ion exchange "spike" (DOLsp) that is about 10 microns deep. In one or more embodiments, if the magnitude of CT is low (e.g., less than 20 MPa, preferably less than 10 MPa), there is insufficient tension to propagate the crack across the thickness of the glass-based article as shown by experimental results. The source of tensile stress is limited to the contact stress from a drop/impact event and/or an externally applied tension from bending which is immediately removed after the drop/impact is over.

In strengthened glass-based substrates, there is a stress profile in which there is a compressive stress (CS) on the surface and tension (central tension, or CT) in the center of the glass. According to one or more embodiments, the glass-based article can be thermally strengthened, chemically strengthened, or a combination of thermally strengthened and chemically strengthened. As used herein, "thermally strengthened" refers to substrates that are heat treated to improve the strength of the substrate, and includes tempered substrates and heat-strengthened substrates, for example tempered glass and heat-strengthened glass. Tempered glass involves an accelerated cooling process, which creates higher surface compression and/or edge compression in the glass. Factors that impact the degree of surface compression in tempered glass include the air-quench temperature and other variables that can create a surface compression of at least 10,000 pounds per square inch (psi). Tempered glass is typically four to five times stronger than annealed or untreated glass. Heat-strengthened glass is produced by a lower differential cooling than tempered glass, which results in a lower compression strength at the surface and heat-strengthened glass is typically approximately twice as strong as annealed, or untreated, glass.

Traditionally, tempered glass has been used to prevent failures caused by the introduction of such flaws into the glass because tempered glass often exhibits deep compressive stress (CS) layers (e.g., approximately 21% of the total thickness of the glass), which can prevent the flaws from propagating further into the glass and thus, can prevent failure. An example of a stress profile generated by tempering is shown in FIG. 1. In FIG. 1, the tempered glass article 100 includes a first surface 101, a thickness $t_1$, and a surface CS 110. The thermally treated glass article 100 exhibits a CS that decreases from the first surface 101 to a depth of compression (DOC) 130, where the stress changes from compressive to tensile stress. The tensile stress reaches a maximum central tension (CT) 120.

Tempering has generally been limited to thick glass-based articles (i.e., glass-based articles having a thickness $t_1$ of about 3 millimeters or greater) because, to achieve the thermal strengthening and the desired residual stresses, a sufficient thermal gradient must be formed between the core of such articles and the surface. Such thick articles may be undesirable or not practical in many applications such as displays (e.g., consumer electronics, including mobile phones, tablets, computers, navigation systems, and the like), architecture (e.g., windows, shower panels, countertops, etc.), transportation (e.g., automobiles, trains, aircraft, sea craft, etc.), appliances, or any application that requires superior fracture resistance but thin and light-weight articles. According to one or more embodiments, the stress-profiles described herein can be achieved by thermal strengthening.

Figure 2:
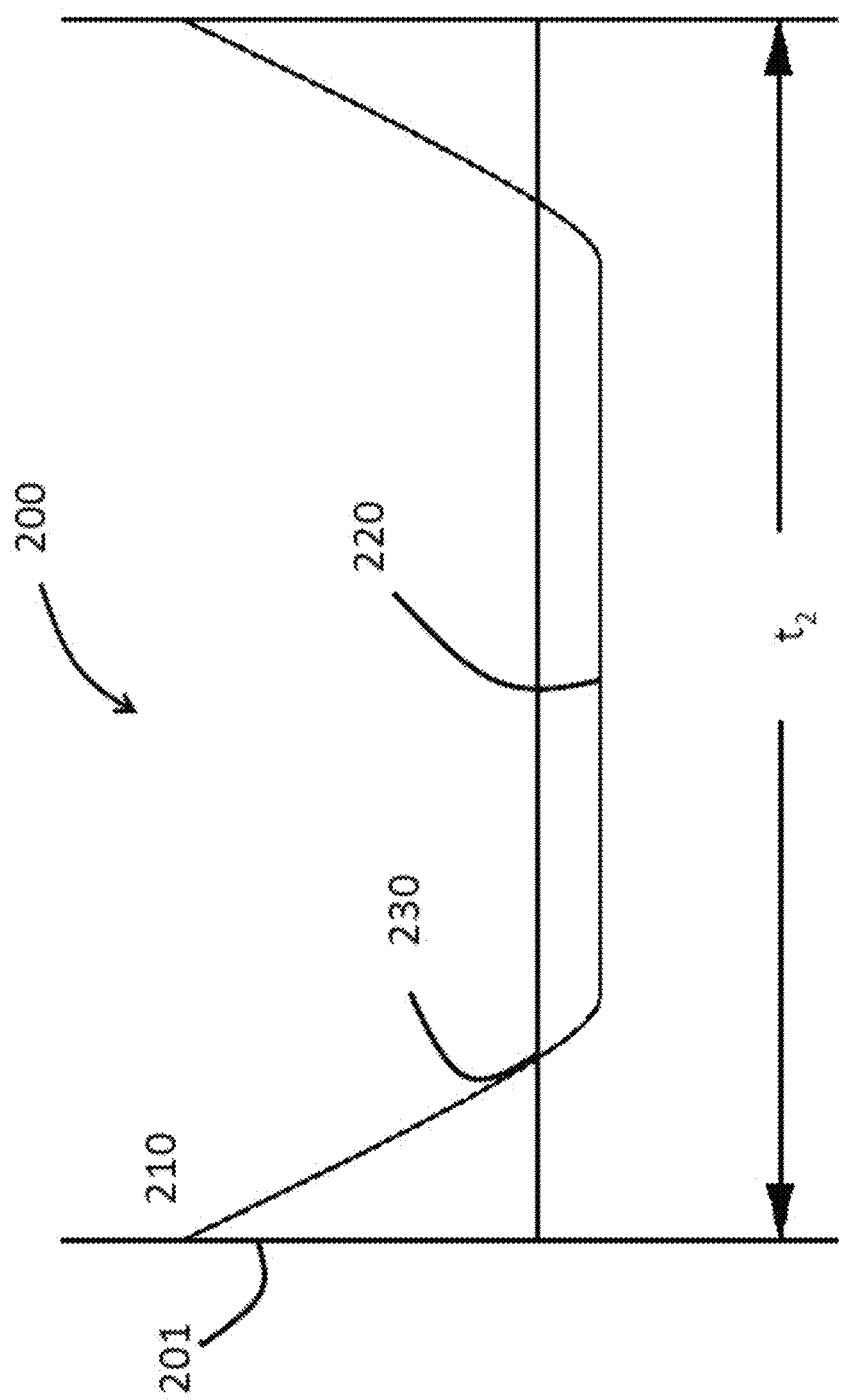
FIG. 2 is a cross-sectional representation of a stress profile across a thickness of a strengthened glass-based article.

Although chemical strengthening is not limited by the thickness of the glass-based article in the same manner as thermal strengthening, chemically strengthened glass-based articles do not necessarily exhibit the stress profile of thermally strengthened glass-based articles. An example of a stress profile generated by chemical strengthening (e.g., by an ion exchange process), is shown in FIG. 2. In FIG. 2, the chemically strengthened glass-based article 200 includes a first surface 201, a thickness $t_2$ and a surface CS 210. The glass-based article 200 exhibits a CS that decreases from the first surface 201 to a depth of compression (DOC) 230, and exhibits a maximum central tension (CT) 220. As shown in FIG. 2, such profiles exhibit a substantially flat CT region or CT region with a constant or near constant tensile stress along at least a portion of the CT region. Often, chemically strengthened glass-based articles exhibit a lower maximum CT value, as compared to the maximum CT value of tempered glass-based articles of the type shown in FIG. 1.

In chemically strengthened glass substrates, the replacement of smaller ions by larger ions at a temperature below that at which the glass network can significantly relax produces a distribution of ions across the surface of the glass that results in a stress profile. The larger volume of the incoming ion produces a compressive stress (CS) on the surface and tension (central tension, or CT) in the center of the glass. Compressive stress (including surface CS) is measured by surface stress meter (FSM) using commercially available instruments such as the FSM-6000, manufactured by Orihara Industrial Co., Ltd. (Japan). Surface stress measurements rely upon the accurate measurement of the stress optical coefficient (SOC), which is related to the birefringence of the glass. SOC in turn is measured according to Procedure C (Glass Disc Method) described in ASTM standard C770-16, entitled "Standard Test Method for Measurement of Glass Stress-Optical Coefficient," the contents of which are incorporated herein by reference in their entirety.

According to one or more embodiments, the increase or decrease in strength on one side of a glass-based substrate can be determined using abraded ring on ring (AROR) testing. The strength of a material is defined as the stress at which fracture occurs. The AROR test is a surface strength measurement for testing flat glass specimens, and ASTM C1499-09(2013), entitled "Standard Test Method for Monotonic Equibiaxial Flexural Strength of Advanced Ceramics at Ambient Temperature," serves as the basis for the AROR test methodology described herein. The contents of ASTM C1499-09 are incorporated herein by reference in their entirety. The glass specimen is abraded prior to ring-on-ring testing with 90 grit silicon carbide (SiC) particles that are delivered to the glass sample using the method and apparatus described in Annex A2, entitled "abrasion Procedures," of ASTM C158-02(2012), entitled "Standard Test Methods for Strength of Glass by Flexure (Determination of Modulus of Rupture). The contents of ASTM C158-02 and the contents of Annex 2 in particular are incorporated herein by reference in their entirety.

Prior to ring-on-ring testing a surface of the glass-based article is abraded as described in ASTM C158-02, Annex 2, to normalize and/or control the surface defect condition of the sample using the apparatus shown in Figure A2.1 of ASTM C158-02. The abrasive material is sandblasted onto the surface of the glass-based article at an air pressure of 15 psi. After air flow is established, 5 $cm^3$ of abrasive material is dumped into a funnel and the sample is sandblasted for 5 seconds after introduction of the abrasive material.

Figure 9:
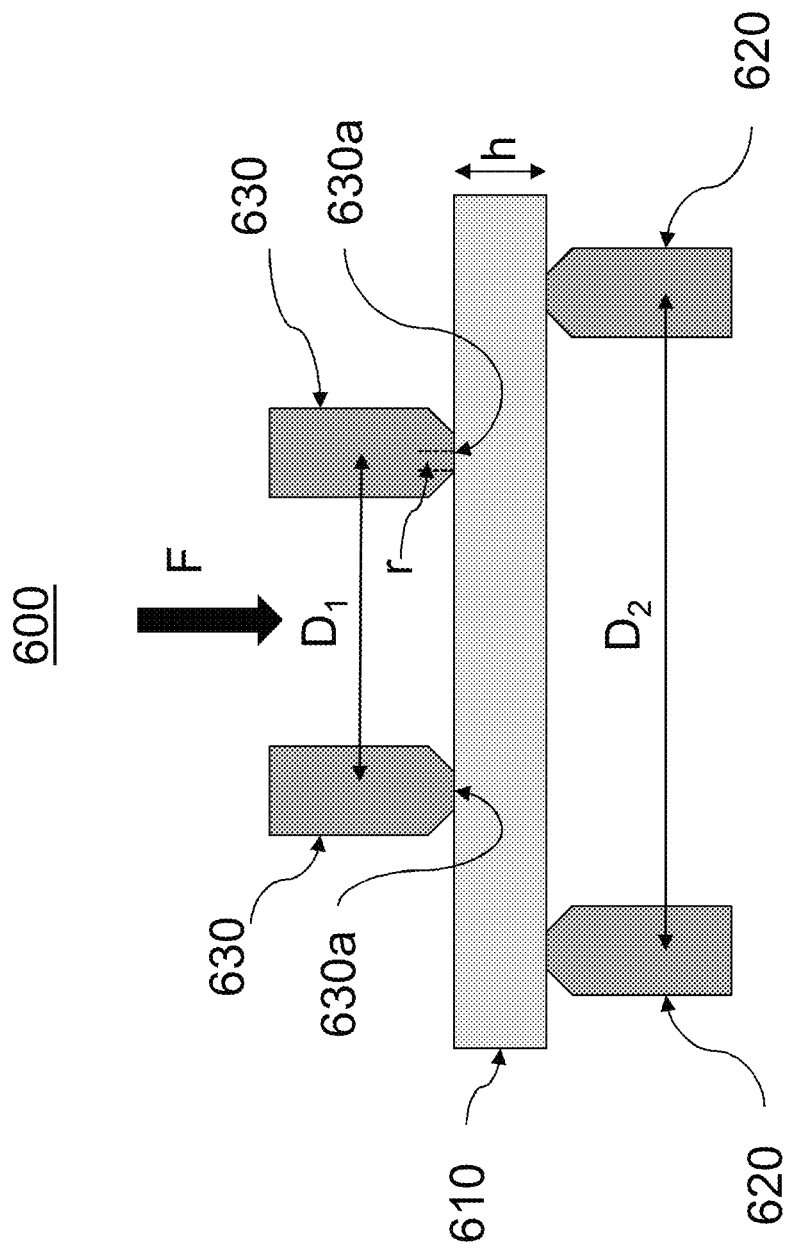
FIG. 9 is a schematic cross-sectional view of the apparatus that was used to perform the abraded ring-on-ring (AROR) test described herein.

For the AROR test, a glass-based article having at least one abraded surface is placed between two concentric rings of differing size to determine equibiaxial flexural strength (i.e., the maximum stress that a material is capable of sustaining when subjected to flexure between two concentric rings), as shown in FIG. 9. In the AROR configuration 600, the abraded glass-based article 610 is supported by a support ring 620 having a diameter $D_2$. A force F is applied by a load cell (not shown) to the surface of the glass-based article by a loading ring 630 having a diameter $D_1$.

The ratio of diameters of the loading ring and support ring D1/D2 may be in a range from 0.2 to 0.5. In some embodiments, $D_1/D_2$ is 0.5. Loading and support rings 630, 620 should be aligned concentrically to within 0.5% of support ring diameter $D_2$. The load cell used for testing should be accurate to within ±1% at any load within a selected range. Testing is carried out at a temperature of 23±2° C. and a relative humidity of 40±10%.

For fixture design, the radius r of the protruding surface of the loading ring 630 is in a range of h/2≤r≤3 h/2, where h is the thickness of glass-based article 610. Loading and support rings 630, 620 are made of hardened steel with hardness HRc>40. AROR fixtures are commercially available.

The intended failure mechanism for the AROR test is to observe fracture of the glass-based article 610 originating from the surface 630a within the loading ring 630. Failures that occur outside of this region—i.e., between the loading ring 630 and support ring 620—are omitted from data analysis. Due to the thinness and high strength of the glass-based article 610, however, large deflections that exceed ½ of the specimen thickness h are sometimes observed. It is therefore not uncommon to observe a high percentage of failures originating from underneath the loading ring 630. Stress cannot be accurately calculated without knowledge of stress development both inside and under the ring (collected via strain gauge analysis) and the origin of failure in each specimen. AROR testing therefore focuses on peak load at failure as the measured response.

The strength of glass-based article depends on the presence of surface flaws. However, the likelihood of a flaw of a given size being present cannot be precisely predicted, as the strength of glass is statistical in nature. A probability distribution can therefore be used as a statistical representation of the data obtained.

Figure 3:
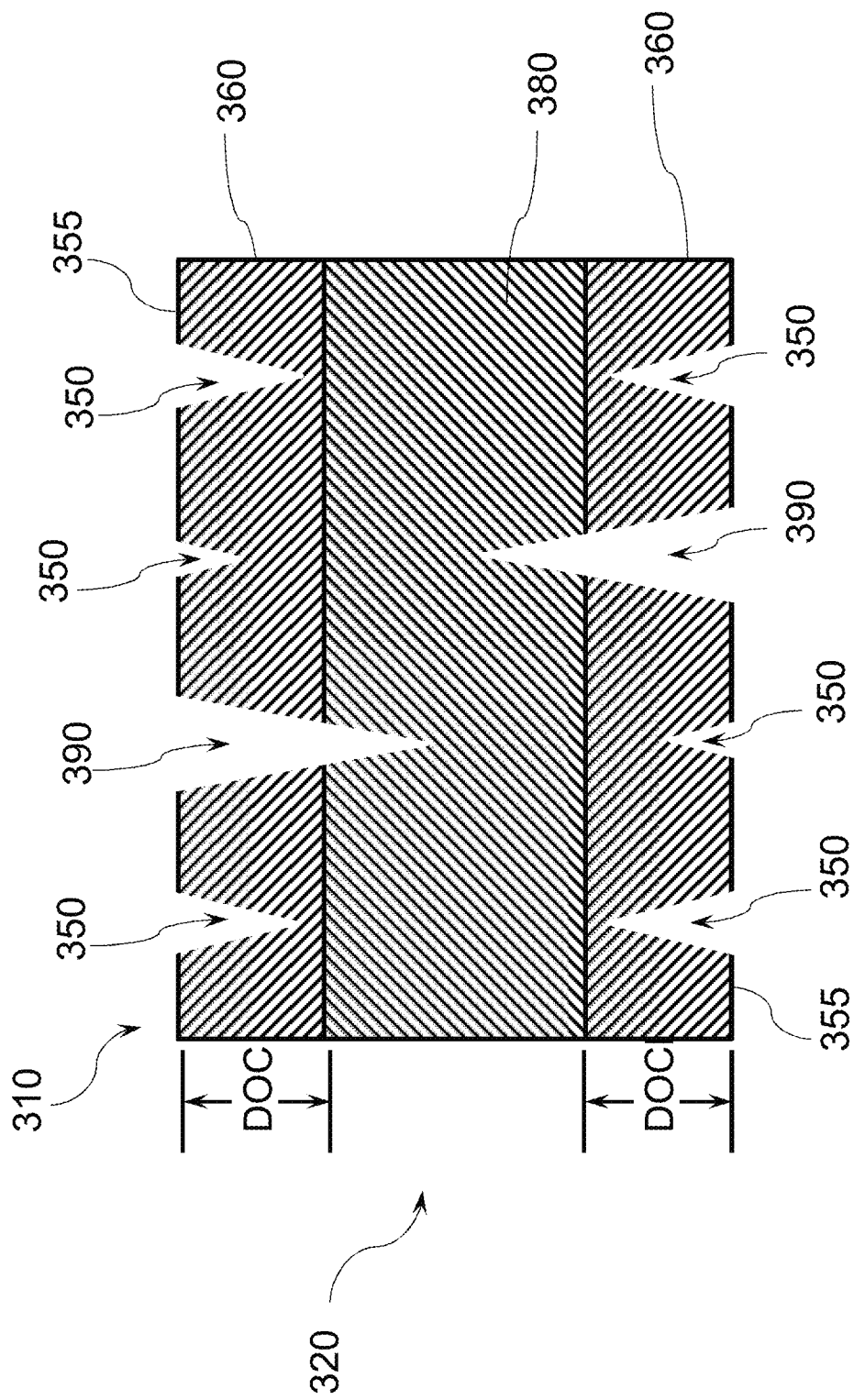
FIG. 3 illustrates a cross-sectional view of a glass based article with a surface having a plurality of cracks.

Referring now to FIG. 3, an exemplary embodiment of a cross-sectional view of a strengthened glass-based article 320 comprising a glass-based substrate 310 is illustrated. The strengthened glass-based article 320 is shown as having a plurality of cracks. The strengthened glass-based article 320 has compressive stress regions 360 at the surfaces and a central tension region 380. The depth of compression (DOC) is shown on each side of the strengthened glass-based article 320 in FIG. 3. Small cracks 350 in the compressive stress regions 360 of the glass-based substrate 310 that do not extend into the central tension region 380 of the glass are shown, along with large cracks 390 that penetrate into the central tension region 380 of the strengthened glass-based article 320. It will be appreciated that the size of the features, namely the small cracks 350 and large cracks 390 are exaggerated to illustrate the concept. If the damage extends beyond the DOC, and if the central tension is of a high enough magnitude, the flaw will propagate until it reaches the material's critical stress intensity level and will ultimately fracture the glass.

According to one or more embodiments, the strengthened glass-based article 320 has at least one external surface 355 that is exposed to a user of the device, and the external surface 355 is susceptible to sharp contact damage, for example, when the device is dropped by a user of the device. According to one or more embodiments, the strengthened glass-based article 320 can be a chemically strengthened glass-based substrate, a thermally strengthened glass-based substrate or a glass-based substrate that has been both chemically strengthened and thermally strengthened.

The glass-based substrate 310 used to form the strengthened glass-based article 320 may be provided using a variety of different processes. For example, exemplary glass substrate forming methods include float glass processes and down-draw processes, such as fusion draw and slot draw. A glass substrate prepared by a float glass process may be characterized by smooth surfaces and uniform thickness is made by floating molten glass on a bed of molten metal, typically tin. In an exemplary process, molten glass that is fed onto the surface of the molten tin bed forms a floating glass ribbon. As the glass ribbon flows along the tin bath, the temperature is gradually decreased until the glass ribbon solidifies into a solid glass substrate that can be lifted from the tin onto rollers. Once off the bath, the glass substrate can be cooled further and annealed to reduce internal stress.

Down-draw processes produce glass substrates having a uniform thickness that possess relatively pristine surfaces. Because the average flexural strength of the glass substrate is controlled by the amount and size of surface flaws, a pristine surface that has had minimal contact has a higher initial strength. When this high strength glass substrate is then further strengthened (e.g., chemically), the resultant strength can be higher than that of a glass substrate with a surface that has been lapped and polished. Down-drawn glass substrates may be drawn to a thickness of less than about 2 mm. In addition, down drawn glass substrates have a very flat, smooth surface that can be used in its final application without costly grinding and polishing.

The fusion draw process, for example, uses a drawing tank that has a channel for accepting molten glass raw material. The channel has weirs that are open at the top along the length of the channel on both sides of the channel. When the channel fills with molten material, the molten glass overflows the weirs. Due to gravity, the molten glass flows down the outside surfaces of the drawing tank as two flowing glass films. These outside surfaces of the drawing tank extend down and inwardly so that they join at an edge below the drawing tank. The two flowing glass films join at this edge to fuse and form a single flowing glass substrate. The fusion draw method offers the advantage that, because the two glass films flowing over the channel fuse together, neither of the outside surfaces of the resulting glass substrate comes in contact with any part of the apparatus. Thus, the surface properties of the fusion drawn glass substrate are not affected by such contact.

The slot draw process is distinct from the fusion draw method. In slot draw processes, the molten raw material glass is provided to a drawing tank. The bottom of the drawing tank has an open slot with a nozzle that extends the length of the slot. The molten glass flows through the slot/nozzle and is drawn downward as a continuous substrate and into an annealing region.

The terms "glass-based article" and "glass-based substrate" are used to include any object made wholly or partly of glass. In some embodiments, glass-based articles include laminates of glass and non-glass materials, laminates of glass and crystalline materials, and glass-ceramics (including an amorphous phase and a crystalline phase). Glass substrates according to one or more embodiments can be selected from soda-lime silicate glass (SLS), alkali-aluminosilicate glass, alkali-containing borosilicate glass, alkali-containing aluminoborosilicate glass, and alkali-free aluminosilicate glass.

It is noted that the terms "substantially" and "about" may be utilized herein to represent the inherent degree of uncertainty that may be attributed to any quantitative comparison, value, measurement, or other representation. These terms are also utilized herein to represent the degree by which a quantitative representation may vary from a stated reference without resulting in a change in the basic function of the subject matter at issue. Thus, for example, a glass-based article that is "substantially free of MgO." As used herein, the phrases "substantially free" or "free" with respect to the components of the composition means that the component is not actively or intentionally added to the composition during initial batching, but may be present as an impurity in an amount less than about 0.01 mol %.

Unless otherwise specified, all compositions described herein are expressed in terms of mole percent (mol %).

Figure 6:
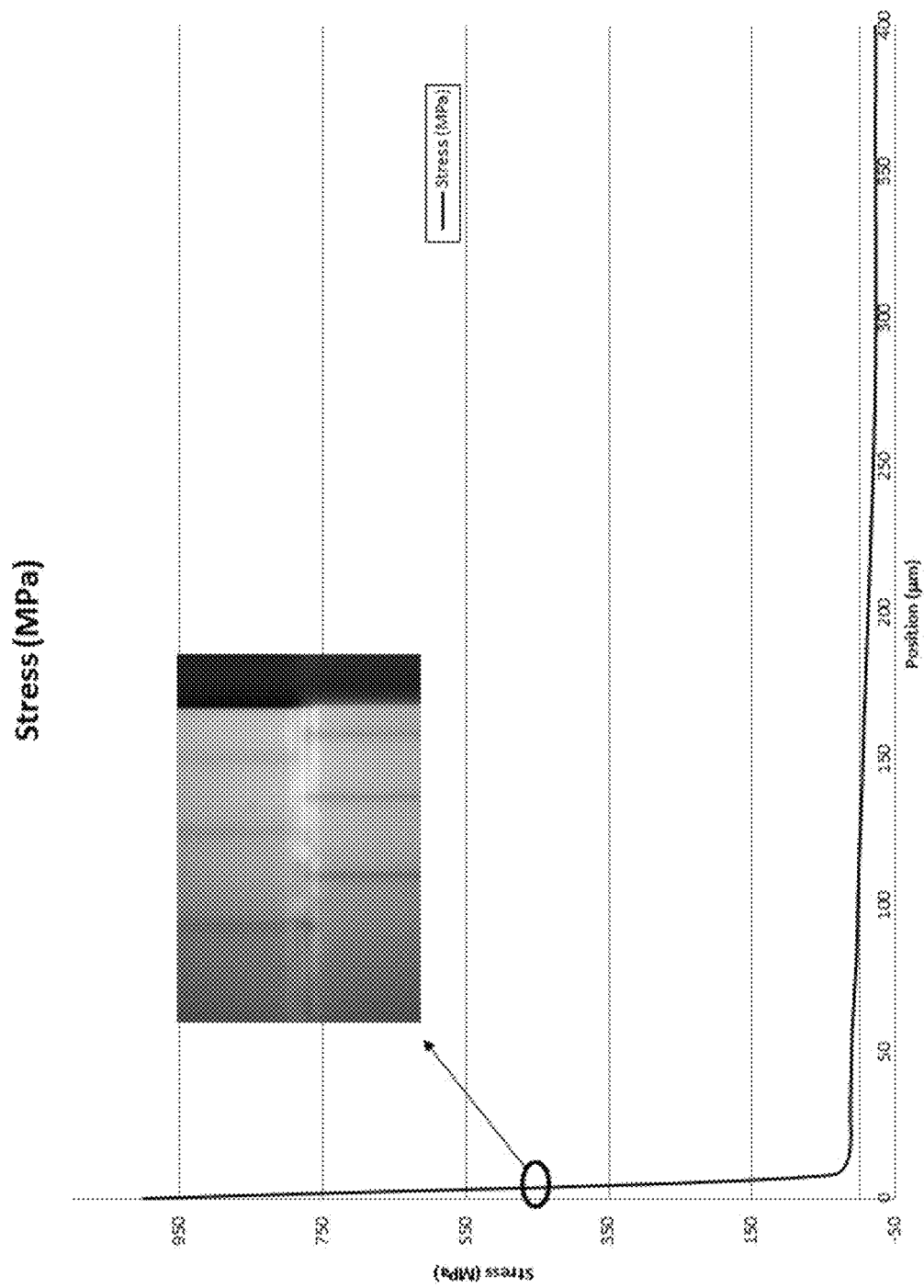
FIG. 6 is a graph of a portion of a stress profile for Sample C described herein.

According to the convention normally used in mechanical arts, compressive stress is expressed as negative (<0) and tensile stress is expressed as positive (>0). Throughout this description, however, compressive stress (CS) is expressed as a positive or absolute value—i.e., as recited herein, CS=|CS|. In addition, while the tensile stress is shown in FIG. 6 as negative, throughout this description CT values will be expressed as a positive or absolute value—i.e. CT=|CT|.

As used herein, "depth of compression" or DOC is the depth from the surface of the glass-based article at which the stress changes from compressive to tensile. DOC may be measured by FSM or a scattered light polariscope (SCALP) depending on the ion exchange treatment. Where the stress in the glass article is generated by exchanging potassium ions into the glass article, FSM is used to measure DOC. Where the stress is generated by exchanging sodium ions into the glass article, SCALP is used to measure DOC. Where the stress in the glass article is generated by exchanging both potassium and sodium ions into the glass, the DOC is measured by SCALP, since it is believed the exchange depth of sodium indicates the DOC and the exchange depth of potassium ions indicates a change in the magnitude of the compressive stress (but not the change in stress from compressive to tensile); the exchange depth of potassium ions in such glass articles is measured by FSM.

Unless otherwise specified, CT and CS are expressed herein in megaPascals (MPa), whereas thickness and DOC are expressed in millimeters or microns (micrometers). Refracted near-field (RNF) method or SCALP may be used to measure the stress profile. The maximum CT is measured by SCALP. When the RNF method is utilized to measure the stress profile, the maximum CT value provided by SCALP is utilized in the RNF method. In particular, the stress profile measured by RNF is force balanced and calibrated to the maximum CT value provided by a SCALP measurement. The RNF method is described in U.S. Pat. No. 8,854,623, entitled "Systems and methods for measuring a profile characteristic of a glass sample", which is incorporated herein by reference in its entirety. In particular, the RNF method includes placing the glass article adjacent to a reference block, generating a polarization-switched light beam that is switched between orthogonal polarizations at a rate of between 1 Hz and 50 Hz, measuring an amount of power in the polarization-switched light beam and generating a polarization-switched reference signal, wherein the measured amounts of power in each of the orthogonal polarizations are within 50% of each other. The method further includes transmitting the polarization-switched light beam through the glass sample and reference block for different depths into the glass sample, then relaying the transmitted polarization-switched light beam to a signal photodetector using a relay optical system, with the signal photodetector generating a polarization-switched detector signal. The method also includes dividing the detector signal by the reference signal to form a normalized detector signal and determining the profile characteristic of the glass sample from the normalized detector signal.

Described herein are strengthened glass-based articles that include glasses, such as silicate glasses including alkali-containing glass, and glass-ceramics that may be used as a cover glass for mobile electronic devices, wearables electronic devices and touch-enabled displays. The glass-based articles may also be used in displays (or as display articles) (e.g., billboards, point of sale systems, computers, navigation systems, and the like), architectural articles (walls, fixtures, panels, windows, etc.), transportation articles (e.g., in automotive applications, trains, aircraft, sea craft, etc.), appliances (e.g., washers, dryers, dishwashers, refrigerators and the like), or any article that requires some fracture resistance.

In some embodiments, the glass-based articles are strengthened thermally. In other embodiments, the glass-based articles described herein are chemically strengthened by ion exchange and exhibit stress profiles that are distinguished from those exhibited by pre-existing strengthened glass articles. In this disclosure, a "glass-based substrate" is generally unstrengthened and a "glass-based article" is generally a glass-based substrate that has been strengthened (by, for example, thermal or chemical strengthening). In an ion exchange process, ions at or near the surface of the glass-based article are replaced by—or exchanged with—larger ions having the same valence or oxidation state. In those embodiments in which the glass-based article comprises an alkali aluminosilicate glass, ions in the surface layer of the glass and the larger ions may be monovalent alkali metal cations, such as $Li^+$ (when present in the glass-based article), $Na^+$, $K^+$, $Rb^+$, and $Cs^+$.

Ion exchange processes are typically carried out by immersing a glass-based substrate in a molten salt bath (or two or more molten salt baths) containing the larger ions to be exchanged with the smaller ions in the glass-based substrate. It should be noted that aqueous salt baths may also be utilized. In addition, the composition of the bath(s) according to one or more embodiments includes more than one type of larger ion (e.g., Na+ and K+). It will be appreciated by those skilled in the art that parameters for the ion exchange process, including, but not limited to, bath composition and temperature, immersion time, the number of immersions of the glass-based article in a salt bath (or baths), use of multiple salt baths, additional steps such as annealing, washing, and the like, are generally determined by the composition of the glass-based article (including the structure of the article and any crystalline phases present) and the desired DOC and CS of the glass-based article that results from strengthening. By way of example, ion exchange of glass-based substrates may be achieved by immersion of the glass-based substrates in at least one molten bath containing a salt such as, but not limited to, nitrates, sulfates, and chlorides of the larger alkali metal ion. Typical nitrates include $KNO_3$, $NaNO_3$, $LiNO_3$, and combinations thereof. The temperature of the molten salt bath typically is in a range from about 350° C. up to about 480° C., while immersion times range from about 15 minutes up to about 100 hours depending on glass thickness, bath temperature and glass (or monovalent ion) diffusivity. However, temperatures and immersion times different from those described above may also be used.

In one or more embodiments, the glass-based substrates may be immersed in a molten salt bath of 100% $NaNO_3$ or 100% $KNO_3$ having a temperature from about 350° C. to about 480° C. for times ranging from about 15 minutes up to about 100 hours depending on glass thickness, bath temperature and glass (or monovalent ion) diffusivity. In the molten baths described in this disclosure, all percentages are percent by weight. In some embodiments, the glass-based substrate may be immersed in a molten mixed salt bath having a temperature from about 350° C. to about 480° C. and including from about 5% to about 90% $KNO_3$ and from about 10% to about 95% $NaNO_3$ for times ranging from about 15 minutes up to about 100 hours depending on glass thickness, bath temperature and glass (or monovalent ion) diffusivity.

According to one or more embodiments, the glass-based article comprises a glass as described in U.S. Pat. No. 8,951,927, the entire content of which is incorporated herein by reference. Such glasses, according to one or more embodiments of this disclosure, comprise at least about 50 mol % $SiO_2$; at least about 10 mol % $R_2O$, wherein $R_2O$ comprises $Na_2O$; $Al_2O_3$, wherein $Al_2O_3$ (mol %)<$R_2O$ (mol %); and $B_2O_3$, and wherein $B_2O_3$ (mol %)-($R_2O$ (mol %)-$Al_2O_3$ (mol %))≥3 mol %. In some embodiments, such glasses also comprise 66-74 mol % $SiO_2$; ≥2.7 mol % $B_2O_3$; 9-22 mol % $Al_2O_3$; 9-20 mol % $Na_2O$; and at least about 0.1 mol % of at least one of MgO and ZnO, wherein $R_2O$+CaO+SrO+BaO—$Al_2O_3$—$B_2O_3$<0. In specific embodiments, the strengthened substrate comprises a glass comprising at least about 50 mol % $SiO_2$; at least about 10 mol % $R_2O$, wherein $R_2O$ comprises $Na_2O$; $Al_2O_3$; and $B_2O_3$, wherein $B_2O_3$ (mol %)-($R_2O$ (mol %)-$Al_2O_3$ (mol %))≥3 mol %, and wherein the glass has a zircon breakdown temperature that is equal to the temperature at which the glass has a viscosity in a range from about 25 kPoise to about 40 kPoise. In specific embodiments, the strengthened substrate comprises a glass comprising an ion exchanged glass having a Vickers crack initiation threshold of at least 3 kilogram force (kgf), such as at least 4 kilogram force (kgf), at least 5 kilogram force (kgf), at least 6 kilogram force (kgf), at least 7 kilogram force (kgf), at least 8 kilogram force (kgf), at least 9 kilogram force (kgf), or at least 10 kilogram force (kgf), the glass comprising at least about 50 mol % $SiO_2$; at least about 10 mol % $R_2O$, wherein $R_2O$ comprises $Na_2O$; $Al_2O_3$, wherein $Al_2O_3$ (mol %)<$R_2O$ (mol %); $B_2O_3$, wherein $B_2O_3$ (mol %)-($R_2O$ (mol %)-$Al_2O_3$ (mol %))≥3 mol %. In some embodiments, the strengthened substrate comprises a glass comprising an ion exchanged glass having a Vickers crack initiation threshold of at least 3 kilogram force (kgf), such as at least 4 kilogram force (kgf), at least 5 kilogram force (kgf), at least 6 kilogram force (kgf), at least 7 kilogram force (kgf), at least 8 kilogram force (kgf), at least 9 kilogram force (kgf), or at least 10 kilogram force (kgf), the glass comprising 66-74 mol % $SiO_2$; ≥2.7 mol % $B_2O_3$; 9-22 mol % $Al_2O_3$; 9-20 mol % $Na_2O$; and at least about 0.1 mol % of at least one of MgO and ZnO, wherein $R_2O$+CaO+SrO+BaO-$Al_2O_3$—$B_2O_3$<0. In specific embodiments, the strengthened substrate comprises a glass comprising at least about 50 mol % $SiO_2$; at least about 10 mol % $R_2O$, wherein $R_2O$ comprises $Na_2O$; $Al_2O_3$; and at least 2.7 mol % $B_2O_3$ containing coordinated boron cations, wherein $B_2O_3$— ($R_2O$—$Al_2O_3$)≥3 mol %. In specific embodiments, these glasses comprise at least 0.1 mol % of at least one of MgO and ZnO. In specific embodiments, these glasses comprise from about 2.7 mol % to about 4.5 mol % $B_2O_3$. In a highly specific embodiment, the strengthened substrate comprises a glass comprising 66-74 mol % $SiO_2$; at least about 10 mol % $R_2O$, wherein $R_2O$ comprises at least $Na_2O$; 9-22 mol % $Al_2O_3$; at least 2.7 mol % $B_2O_3$, wherein $B_2O_3$— ($R_2O$—$Al_2O_3$)≥3 mol %; and at least 0.1 mol % of at least one of MgO and ZnO. According to one or more embodiments, at least 50% of the $B_2O_3$ present in the glass comprises three-fold coordinated boron cations.

In one or more embodiments, the glass-based articles can have a nominal composition before ion exchange of about 67.37 mol % $SiO_2$, 3.67 mol % $B_2O_3$, 12.73 mol % $Al_2O_3$, 13.77 mol % $Na_2O$, 0.01 mol % $K_2O$, 2.39 mol % MgO, 0.01 mol % $Fe_2O_3$, 0.01 mol % $ZrO_2$, and 0.09 mol % $SnO_2$.

In one or more specific embodiments, the strengthened substrate comprises alkali aluminosilicate glasses that are resistant to damage due to sharp impact and capable of fast ion exchange. Examples of such glasses are disclosed in U.S. Pat. No. 9,156,724, the entire content of which is incorporated herein by reference. Examples of such alkali aluminosilicate glasses comprise at least 4 mol % $P_2O_5$ and, when ion exchanged, have a Vickers crack initiation threshold of at least about 3 kgf, such as at least about 4 kgf, at least about 5 kgf, at least about 6 kgf, or at least about 7 kgf. In one or more specific embodiments, the strengthened substrate comprises an alkali aluminosilicate glass comprising at least about 4 mol % $P_2O_5$ and from 0 mol % to about 4 mol % $B_2O_3$, wherein the alkali aluminosilicate glass is $Li_2O$-free and wherein: 1.3<[($P_2O_5$+$R_2O$)/$M_2O_3$]≤2.3; where $M_2O_3$=$Al_2O_3$+$B_2O_3$, and $R_2O$ is the sum of monovalent cation oxides present in the alkali aluminosilicate glass. In specific embodiments, such alkali aluminosilicate glasses comprise less than 1 mol % $K_2O$, for example 0 mol % $K_2O$. In specific embodiments, such alkali aluminosilicate glasses comprise less than 1 mol % $B_2O_3$, for example 0 mol % $B_2O_3$. In specific embodiments, such alkali aluminosilicate glasses include monovalent and divalent cation oxides are selected from the group consisting of $Na_2O$, $K_2O$, $Rb_2O$, $Cs_2O$, MgO, CaO, SrO, BaO, and ZnO. In highly specific embodiments, such alkali aluminosilicate glasses comprise from about 40 mol % to about 70 mol % $SiO_2$; from about 11 mol % to about 25 mol % $Al_2O_3$; from about 4 mol % to about 15 mol % $P_2O_5$; and from about 13 mol % to about 25 mol % $Na_2O$.

In one or more embodiments, the glass-based articles can have a nominal composition before ion exchange of about 57.43 mol % $SiO_2$, 16.10 mol % $Al_2O_3$, 17.05 mol % 2.81 mol % MgO, 0.003 mol % $TiO_2$, 6.54 mol % $P_2O_5$, and 0.07 mol % $SnO_2$.

In one or more embodiments, $Li_2O$ is present in the glass-based article in a range of 0.1 mol % and 20 mol %, and in more specific embodiments, in a range of 0.1 mol % and 10 mol %. In one or more embodiments, $P_2O_5$ is present in the glass-based article in a range of 0.1 mol % and 10 mol %. In one or more embodiments, the glass-based article is free of $K_2O$.

In one or more embodiments, the glass-based article substrate (prior to being chemically strengthened as described herein) may include a glass composition, in mole percent (mol %), including: $SiO_2$ in the range from about 40% to about 80%, $Al_2O_3$ in the range from about 10% to about 30%, $B_2O_3$ in the range from about 0% to about 10%, $R_2O$ in the range from about 0% to about 20%, and RO in the range from about 0% to about 15%. As used herein, $R_2O$ refers to the total amount of alkali metal oxides, such as $Li_2O$, $Na_2O$, $K_2O$, $Rb_2O$, and $Cs_2O$. As used herein, RO refers to the total amount of alkaline earth metal oxides, such as MgO, CaO, SrO, BaO, and ZnO. In some instances, the composition may include either one or both of $ZrO_2$ in the range from about 0 mol % to about 5 mol % and $P_2O_5$ in the range from about 0 to about 15 mol %. In some embodiments, $TiO_2$ can be present from about 0 mol % to about 2 mol %.

In some embodiments, the glass composition may include $SiO_2$ in an amount, in mol %, in the range from about 45% to about 80%, such as from about 45% to about 75%, from about 45% to about 70%, from about 45% to about 65%, from about 45% to about 60%, from about 50% to about 80%, from about 50% to about 75%, from about 50% to about 70%, from about 50% to about 65%, from about 55% to about 80%, from about 55% to about 75%, from about 55% to about 70%, from about 55% to about 65%, from about 60% to about 80%, from about 60% to about 75%, from about 60% to about 70%, from about 60% to about 65%, or any sub-ranges contained therein.

In some embodiments, the glass composition may include $Al_2O_3$ in an amount, in mol %, in the range from about 5% to about 30%, such as from about 5% to about 28%, from about 5% to about 26%, from about 5% to about 25%, from about 5% to about 24%, from about 5% to about 22%, from about 5% to about 20%, from about 6% to about 30%, from about 8% to about 30%, from about 10% to about 30%, from about 12% to about 30%, from about 14% to about 30%, from about 15% to about 30%, from about 12% to about 18%, or any sub-ranges contained therein.

In one or more embodiments, the glass composition may include $B_2O_3$ in an amount, in mol %, in the range from about 0% to about 10%, such as from about 0% to about 8%, from about 0% to about 6%, from about 0% to about 4%, from about 0.1% to about 10%, from about 0.1% to about 8%, from about 0.1% to about 6%, from about 0.1% to about 4%, from about 1% to about 10%, from about 2% to about 10%, from about 4% to about 10%, from about 2% to about 8%, from about 0.1% to about 5%, from about 1% to about 3%, or any sub-ranges contained therein. In some instances, the glass composition may be substantially free or free of $B_2O_3$.

In some embodiments, the glass composition may include one or more alkaline earth metal oxides, such as MgO, CaO and ZnO. In some embodiments, the total amount of the one or more alkaline earth metal oxides may be a non-zero amount up to about 15 mol %. In one or more specific embodiments, the total amount of any of the alkaline earth metal oxides may be a non-zero amount up to about 14 mol %, such as up to about 12 mol %, up to about 10 mol %, up to about 8 mol %, up to about 6 mol %, up to about 4 mol %, up to about 2 mol %, or up about 1.5 mol %. In some embodiments, the total amount, in mol %, of the one or more alkaline earth metal oxides may be in the range from about 0.01% to about 10%, from about 0.01% to about 8%, from about 0.01% to about 6%, from about 0.01% to about 5%, from about 0.05% to about 10%, from about 0.05% to about 2%, from about 0.05% to about 1%, or any sub-ranges contained therein. The amount of MgO may be in the range from about 0 mol % to about 5 mol %, such as from about 0.001 mol % to about 1 mol %, from about 0.01 mol % to about 2 mol %, from about 2 mol % to about 4 mol %, or any sub-ranges contained therein. The amount of ZnO may be in the range from about 0 mol % to about 2 mol %, such as from about 1 mol % to about 2 mol %, or any sub-ranges contained therein. The amount of CaO may be from about 0 mol % to about 2 mol %. In one or more embodiments, the glass composition may include MgO and may be substantially free or free of CaO and ZnO. In one variant, the glass composition may include any one of CaO or ZnO and may be substantially free or free of the others of MgO, CaO and ZnO. In one or more specific embodiments, the glass composition may include only two of the alkaline earth metal oxides of MgO, CaO and ZnO and may be substantially free or free of the third of the earth metal oxides.

The total amount, in mol %, of alkali metal oxides $R_2O$ in the glass composition may be in the range from about 5% to about 20%, such as from about 5% to about 18%, from about 5% to about 16%, from about 5% to about 15%, from about 5% to about 14%, from about 5% to about 12%, from about 5% to about 10%, from about 5% to about 8%, from about 5% to about 20%, from about 6% to about 20%, from about 7% to about 20%, from about 8% to about 20%, from about 9% to about 20%, from about 10% to about 20%, from about 11% to about 20%, from about 12% to about 18%, from about 14% to about 18%, or any sub-ranges contained therein.

In one or more embodiments, the glass composition includes $Na_2O$ in an amount in the range from about 0 mol % to about 18 mol %, such as from about 0 mol % to about 16 mol %, from about 0 mol % to about 14 mol %, from about 0 mol % to about 12 mol %, from about 2 mol % to about 18 mol %, from about 4 mol % to about 18 mol %, from about 6 mol % to about 18 mol %, from about 8 mol % to about 18 mol %, from about 8 mol % to about 14 mol %, from about 8 mol % to about 12 mol %, from about 10 mol % to about 12 mol %, or any sub-ranges contained therein. In some embodiments, the composition may include at least about 4 mol % $Na_2O$.

In one or more embodiments, the glass composition may include $K_2O$ in an amount less than about 5 mol %, such as less than about 4 mol %, less than about 3 mol %, less than about 2 mol %, or less than about 1 mol %. In one or more alternative embodiments, the glass composition may be substantially free or free of $K_2O$.

In one or more embodiments, the glass composition may include $Li_2O$ in an amount about 0 mol % to about 18 mol %, such as from about 0 mol % to about 15 mol %, from about 0 mol % to about 10 mol %, from about 0 mol % to about 8 mol %, from about 0 mol % to about 6 mol %, from about 0 mol % to about 4 mol %, from about 0 mol % to about 2 mol %, or any sub-ranges contained therein. In some embodiments, the glass composition may include $Li_2O$ in an amount from about 1 mol % to about 20 mol %, such as from about 2 mol % to about 10 mol %, from about 4 mol % to about 10 mol %, from about 6 mol % to about 10 mol %, from about 5 mol % to about 8 mol %, or any sub-ranges contained therein.

In one or more embodiments, the glass composition may include $Fe_2O_3$. In such embodiments, $Fe_2O_3$ may be present in an amount less than about 1 mol %, such as less than about 0.9 mol %, less than about 0.8 mol %, less than about 0.7 mol %, less than about 0.6 mol %, less than about 0.5 mol %, less than about 0.4 mol %, less than about 0.3 mol %, less than about 0.2 mol %, less than about 0.1 mol %, and all ranges and sub-ranges therebetween. In one or more alternative embodiments, the glass composition may be substantially free or free of $Fe_2O_3$.

In one or more embodiments, the glass composition may include $ZrO_2$. In such embodiments, $ZrO_2$ may be present in an amount less than about 1 mol %, such as less than about 0.9 mol %, less than about 0.8 mol %, less than about 0.7 mol %, less than about 0.6 mol %, less than about 0.5 mol %, less than about 0.4 mol %, less than about 0.3 mol %, less than about 0.2 mol %, less than about 0.1 mol %, and all ranges and sub-ranges therebetween. In one or more alternative embodiments, the glass composition may be substantially free or free of $ZrO_2$.

In one or more embodiments, the glass composition may include $P_2O_5$ in a range from about 0 mol % to about 10 mol %, such as from about 0 mol % to about 8 mol %, from about 0 mol % to about 6 mol %, from about 0 mol % to about 4 mol %, from about 0.1 mol % to about 10 mol %, from about 0.1 mol % to about 8 mol %, from about 2 mol % to about 8 mol %, from about 2 mol % to about 6 mol %, from about 2 mol % to about 4 mol %, or any sub-ranges contained therein. In some instances, the glass composition may be substantially free or free of $P_2O_5$.

In one or more embodiments, the glass composition may include $TiO_2$. In such embodiments, $TiO_2$ may be present in an amount less than about 6 mol %, such as less than about 4 mol %, less than about 2 mol %, or less than about 1 mol %. In one or more alternative embodiments, the glass composition may be substantially free or free of $TiO_2$. In some embodiments, $TiO_2$ is present in an amount in the range from about 0.1 mol % to about 6 mol %, such as from about 0.1 mol % to about 4 mol %, or any sub-ranges contained therein.

In some embodiments, the glass composition may include various compositional relationships. For example, the glass composition may include a ratio of the amount of $Li_2O$ (in mol %) to the total amount of $R_2O$ (in mol %) in the range from about 0 to about 1, such as from about 0 to about 0.5, from about 0 to about 0.4, from about 0.1 to about 0.5, from about 0.2 to about 0.4, or any sub-ranges contained therein.

In some embodiments, the glass composition may include a difference between the total amount of $R_2O$ (in mol %) to the amount of $Al_2O_3$ (in mol %) ($R_2O-Al_2O_3$) in the range from about 0 mol % to about 5 mol %, such as from about 0 mol % to about 4 mol %, from about 0 mol % to about 3 mol %, from about 0.1 mol % to about 4 mol %, from about 0.1 mol % to about 3 mol %, from about 0.1 mol % to about 2 mol %, from about 1 mol % to about 2 mol %, or any sub-ranges contained therein.

In some embodiments, the glass composition may include a difference between the total amount of $R_xO$ (in mol %) to the amount of $Al_2O_3$ (in mol %) ($R_xO-Al_2O_3$) in the range from about 0 mol % to about 5 mol %, such as from about 0 mol % to about 4 mol %, from about 0 mol % to about 3 mol %, from about 0.1 mol % to about 4 mol %, from about 0.1 mol % to about 3 mol %, from about 1 mol % to about 3 mol %, from about 2 mol % to about 3 mol %, or any sub-ranges contained therein. As used herein, $R_xO$ includes $R_2O$ and RO.

In some embodiments, the glass composition may include a ratio of the total amount of $R_2O$ (in mol %) to the amount of $Al_2O_3$ (in mol %) ($R_2O/Al_2O_3$) in the range from about 0 to about 5, such as from about 0 to about 4, from about 0 to about 3, from about 1 to about 4, from about 1 to about 3, from about 1 to about 2, or any sub-ranges contained therein.

In one or more embodiments, the glass composition includes a combined amount of $Al_2O_3$ and $Na_2O$ greater than about 15 mol %, such as greater than 18 mol %, greater than about 20 mol %, or greater than about 23 mol %. The combined amount of $Al_2O_3$ and $Na_2O$ may be up to and including about 35 mol %, such as up to and including about 32 mol %, or up to and including about 30 mol %.

The glass composition of one or more embodiments may exhibit a ratio of the amount of MgO (in mol %) to the total amount of RO (in mol %) in the range from about 0 to about 2.

In some embodiments, glass composition may be substantially free or free of nucleating agents. Examples of nucleating agents are $TiO_2$, $ZrO_2$ and the like. Nucleating agents may be described in terms of function in that nucleating agents are constituents in the glass that can initiate the formation of crystallites in the glass.

In some embodiments, the compositions used for the glass substrate may be batched with from about 0 mol % to about 2 mol % of at least one fining agent selected from a group that includes $Na_2SO_4$, NaCl, NaF, NaBr, $K_2SO_4$, KCl, KF, KBr, and $SnO_2$. The glass composition according to one or more embodiments may further include $SnO_2$ in the range from about 0 mol % to about 2 mol %, such as from about 0 mol % to about 1 mol %, from about 0.1 mol % to about 2 mol %, from about 0.1 mol % to about 1 mol %, from about 1 mol % to about 2 mol %, or any sub-ranges contained therein. The glass compositions disclosed herein may be substantially free or free of $As_2O_3$ and/or $Sb_2O_3$.

In one or more embodiments, the composition may specifically include from about 62 mol % to 75 mol % $SiO_2$; from about 10.5 mol % to about 17 mol % $Al_2O_3$; from about 5 mol % to about 13 mol % $Li_2O$; from about 0 mol % to about 4 mol % ZnO; from about 0 mol % to about 8 mol % MgO; from about 2 mol % to about 5 mol % $TiO_2$; from about 0 mol % to about 4 mol % $B_2O_3$; from about 0 mol % to about 5 mol % $Na_2O$; from about 0 mol % to about 4 mol % $K_2O$; from about 0 mol % to about 2 mol % $ZrO_2$; from about 0 mol % to about 7 mol % $P_2O_5$; from about 0 mol % to about 0.3 mol % $Fe_2O_3$; from about 0 mol % to about 2 mol % $MnO_x$; and from about 0.05 mol % to about 0.2 mol % $SnO_2$.

In one or more embodiments, the composition may include from about 67 mol % to about 74 mol % $SiO_2$; from about 11 mol % to about 15 mol % $Al_2O_3$; from about 5.5 mol % to about 9 mol % $Li_2O$; from about 0.5 mol % to about 2 mol % ZnO; from about 2 mol % to about 4.5 mol % MgO; from about 3 mol % to about 4.5 mol % $TiO_2$; from about 0 mol % to about 2.2 mol % $B_2O_3$; from about 0 mol % to about 1 mol % $Na_2O$; from about 0 mol % to about 1 mol % $K_2O$; from about 0 mol % to about 1 mol % $ZrO_2$; from about 0 mol % to about 4 mol % $P_2O_5$; from about 0 mol % to about 0.1 mol % $Fe_2O_3$; from about 0 mol % to about 1.5 mol % $MnO_x$; and from about 0.08 mol % to about 0.16 mol % $SnO_2$.

In one or more embodiments, the composition may include from about 70 mol % to 75 mol % $SiO_2$; from about 10 mol % to about 15 mol % $Al_2O_3$; from about 5 mol % to about 13 mol % Li$_2$O; from about 0 mol % to about 4 mol % ZnO; from about 0.1 mol % to about 8 mol % MgO; from about 0 mol % to about 5 mol % TiO$_2$; from about 0.1 mol % to about 4 mol % B$_2$O$_3$; from about 0.1 mol % to about 5 mol % Na$_2$O; from about 0 mol % to about 4 mol % K$_2$O; from about 0 mol % to about 2 mol % ZrO$_2$; from about 0 mol % to about 7 mol % P$_2$O$_5$; from about 0 mol % to about 0.3 mol % Fe$_2$O$_3$; from about 0 mol % to about 2 mol % MnO$_x$; and from about 0.05 mol % to about 0.2 mol % SnO$_2$.

In one or more embodiments, the composition may include from about 52 mol % to about 65 mol % SiO$_2$; from about 14 mol % to about 18 mol % Al$_2$O$_3$; from about 5.5 mol % to about 7 mol % Li$_2$O; from about 1 mol % to about 2 mol % ZnO; from about 0.01 mol % to about 2 mol % MgO; from about 4 mol % to about 12 mol % Na$_2$O; from about 0.1 mol % to about 4 mol % P$_2$O$_5$; and from about 0.01 mol % to about 0.16 mol % SnO$_2$. In some embodiments, the composition may be substantially free or free of any one or more of B$_2$O$_3$, TiO$_2$, K$_2$O and ZrO$_2$.

In one or more embodiments, the composition may include at least 0.5 mol % P$_2$O$_5$, Na$_2$O and, optionally, Li$_2$O, where Li$_2$O (mol %)/Na$_2$O (mol %)<1. In addition, these compositions may be substantially free or free of B$_2$O$_3$ and K$_2$O. In some embodiments, the composition may include ZnO, MgO, and SnO$_2$.

In some embodiments, the composition may comprise: from about 58 mol % to about 65 mol % SiO$_2$; from about 11 mol % to about 19 mol % Al$_2$O$_3$; from about 0.5 mol % to about 3 mol % P$_2$O$_5$; from about 6 mol % to about 18 mol % Na$_2$O; from 0 mol % to about 6 mol % MgO; and from 0 mol % to about 6 mol % ZnO. In certain embodiments, the composition may comprise from about 63 mol % to about 65 mol % SiO$_2$; from 11 mol % to about 17 mol % Al$_2$O$_3$; from about 1 mol % to about 3 mol % P$_2$O$_5$; from about 9 mol % to about 20 mol % Na$_2$O; from 0 mol % to about 6 mol % MgO; and from 0 mol % to about 6 mol % ZnO.

In some embodiments, the composition may include the following compositional relationships R$_2$O (mol %)/Al$_2$O$_3$ (mol %)<2, where R$_2$O=Li$_2$O+Na$_2$O. In some embodiments, 65 mol %<SiO$_2$ (mol %)+P$_2$O$_5$ (mol %)<67 mol %. In some embodiments, R$_2$O (mol %)+RO (mol %)-Al$_2$O$_3$ (mol %)+P$_2$O$_5$ (mol %)>−3 mol %, where R$_2$O=Li$_2$O+Na$_2$O and RO is the total amount of divalent metal oxides present in the composition.

In one or more specific embodiments, the glass-based articles can have a nominal composition before exchange about 63.60 mol % SiO$_2$, 15.67 mol % Al$_2$O$_3$, 6.24 mol % Li$_2$O, 10.81 mol % Na$_2$O, 1.16 mol % ZnO, 2.48 mol % P$_2$O$_5$, and 0.04 mol % SnO$_2$.

Where the glass-based article includes a glass-ceramic, the crystal phases may include β-spodumene, rutile, gahnite or other crystal phases and combinations thereof.

The glass-based article may be substantially planar, although other embodiments may utilize a curved or otherwise shaped or sculpted substrate. In some instances, the glass-based article may have a 3D shape or a 2.5D shape. As utilized herein, a "2.5D shape" refers to a sheet shaped article with at least one major surface being at least partially nonplanar, and a second major surface being substantially planar. As utilized herein, a "3D shape" refers to an article with first and second opposing major surfaces that are at least partially nonplanar. The glass-based article may be substantially optically clear, transparent and free from light scattering. The glass-based article may have a refractive index in the range from about 1.45 to about 1.55. As used herein, the refractive index values are with respect to a wavelength of 550 nm.

Additionally or alternatively, the thickness of the glass-based article may be constant along one or more dimension or may vary along one or more of its dimensions for aesthetic and/or functional reasons. For example, the edges of the glass-based article may be thicker as compared to more central regions of the glass-based article. The length, width and thickness dimensions of the glass-based article may also vary according to the article application or use.

Figure 4:
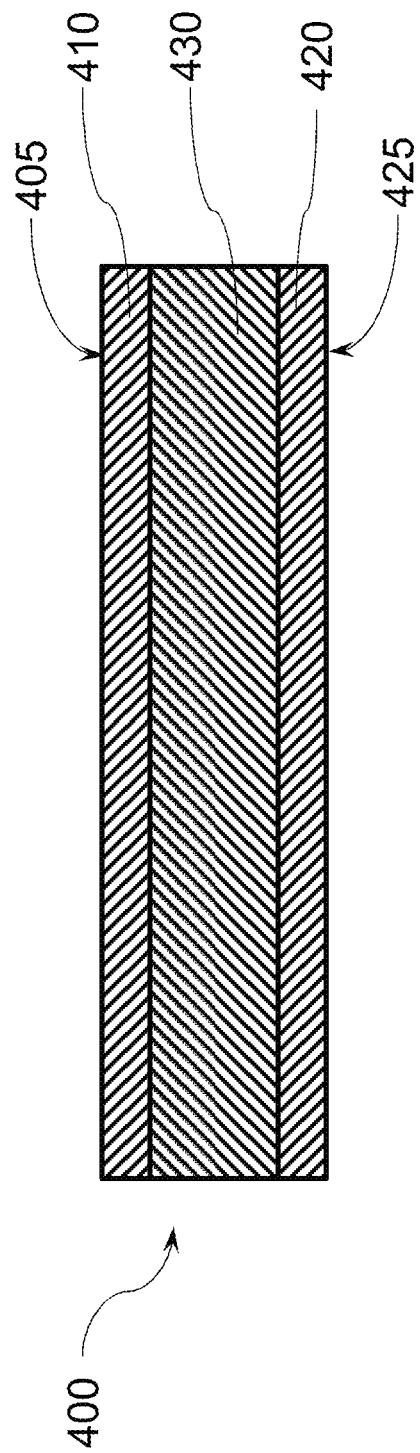
FIG. 4 illustrates a cross-sectional view of a strengthened glass-based article.

Referring now to FIG. 4, an embodiment of a strengthened glass-based article 400 is illustrated. In specific embodiments the strengthened glass-based article 400 is a glass substrate, which has been thermally strengthened and/or chemically strengthened. The strengthened glass-based article 400 has an external surface 405 and an internal surface 425 opposite the external surface 405, where each of the external surface 405 and internal surface 425 may be ion exchanged to provide chemical strengthening and compressive stress regions 410 and 420. The external surface 405 is exposed to a user of the electronic device and is susceptible to sharp impact damage when the device is dropped.

The compressive stress regions 410, 420 of the strengthened glass-based article 400 extend inward from each surface to a DOC (as illustrated in FIG. 2), and there is a central tension region 430 between the two compressive stress regions 410, 420. According to one or more embodiments, the strengthened glass-based article 400 has a maximum central tension value in the central tension region 430 in the range greater than 0.5 MPa and less than 20 MPa.

Embodiments of the disclosure provide glass-based article having a unique stress profile that may be achieved by ion exchange or by thermal treatment. In one or more embodiments, a deep DOC (e.g., to a DOC in a range of from about 5% to about 20% of glass thickness) is achieved. The stress profile achieved according to some embodiments can be described as "parabolic," for example, as shown in FIG. 1. The ion exchange or thermal tempering is allowed to continue until the maximum Central Tension (CT) is below 20 MPa, e.g., in a range of from about 0.5 MPa to about 20 MPa. This value of CT is low enough in magnitude so that an introduced flaw or crack tip cannot propagate from this magnitude of CT alone, but requires externally applied tensile stress (e.g. from applied bending) to further propagate a crack across the cover glass.

Figure 5:
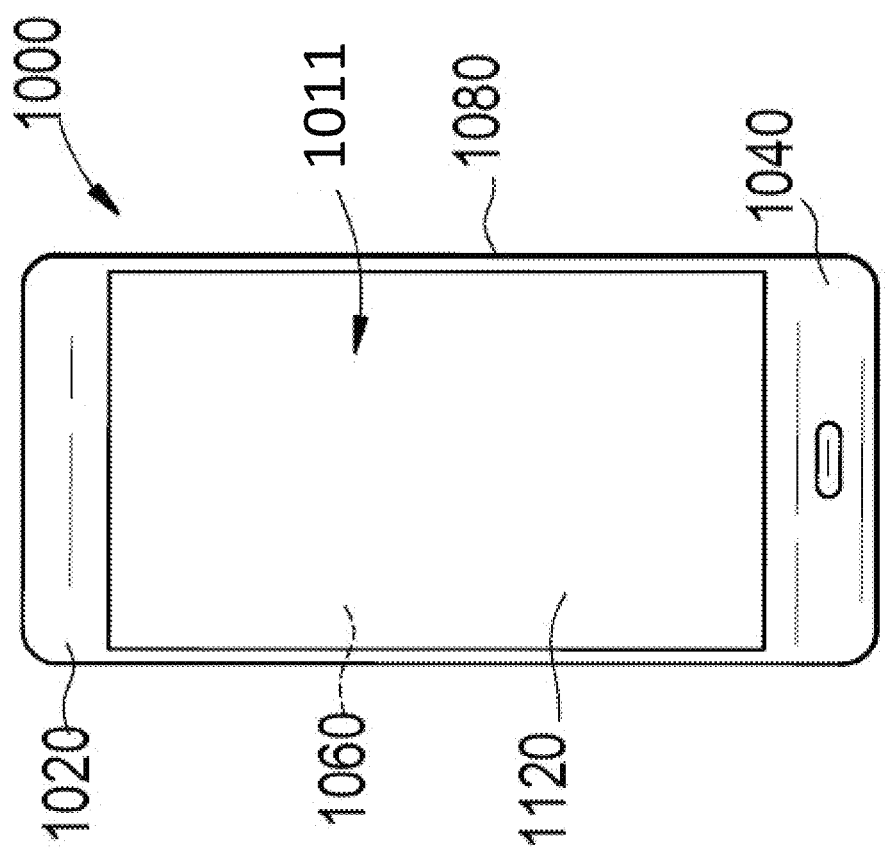
FIG. 5 is a front plan view of an electronic device incorporating one or more embodiments of the glass-based articles described herein.

The glass-based articles described herein can be used in the manufacture of an electronic device. Referring to FIG. 5, an electronic device 1000 may include a glass-based article 1011 according to one or more embodiments described herein. The device 1000 includes a housing 1020 having front 1040, back 1060, and side surfaces 1080; electrical components (not shown) that are at least partially inside or entirely within the housing and including at least a controller, a memory, and a display 1120 at or adjacent to the front surface of the housing. The glass-based article 1011 is shown as a cover disposed at or over the front surface of the housing such that it is over the display 1120. In some embodiments, the glass-based article may be used as a back cover, or some other portion of the housing.

In a first embodiment, a glass-based article comprises a thickness in a range of from about 0.2 mm to about 4.0 mm, a first compressive stress layer extending from a first surface of the glass-based article to a first depth of compression (DOC1) that is in a range of from about 5% to about 20% of the thickness, a second compressive stress layer extending from a second surface of the glass-based article to a second depth of compression (DOC2) that is in a range of from about 5% to about 20% of the thickness, wherein the second surface is opposite the first surface, and a central region extending from the first depth of compression (DOC1) to the second depth of compression (DOC2) and having a maximum tensile stress in a range of from about 0.5 MPa to about 20 MPa.

The first embodiment can be modified so that the thickness can be in a range of from about 0.2 mm to about 3.5 mm, such as about 0.2 mm to about 3.0 mm, about 0.2 mm to about 2.5 mm, about 0.2 mm to about 2.0 mm, about 0.2 mm to about 1.5 mm, about 0.2 mm to about 1.0 mm, about 0.3 to about 4.0 mm, about 0.3 mm to about 3.5 mm, about 0.3 mm to about 3.0 mm, about 0.3 mm to about 2.5 mm, about 0.3 mm to about 2.0 mm, about 0.3 mm to about 1.5 mm, about 0.3 mm to about 1.0 mm, about 0.4 to about 4.0 mm, about 0.4 mm to about 3.5 mm, about 0.4 mm to about 3.0 mm, about 0.4 mm to about 2.5 mm, about 0.4 mm to about 2.0 mm, about 0.4 mm to about 1.5 mm, about 0.4 mm to about 1.0 mm, about 0.5 to about 4.0 mm, about 0.5 mm to about 3.5 mm, 0 about 0.5 mm to about 3.0 mm, about 0.5 mm to about 2.5 mm, about 0.5 mm to about 2.0 mm, about 0.5 mm to about 1.5 mm, about 0.5 mm to about 1.0 mm, or any sub-ranges contained therein.

The first embodiment can be modified so that the first depth of compression (DOC1) and/or the second depth of compression (DOC2) is in a range of from about 6% to about 20% of the thickness, such as about 7% to about 20%, about 8% to about 20%, about 9% to about 20%, about 10% to about 20%, about 11% to about 20%, about 12% to about 20%, about 13% to about 20%, about 14% to about 20%, about 15% to about 20%, about 16% to about 20%, about 17% to about 20%, or any sub-ranges contained therein.

The first embodiment can be modified so that the central region has a maximum tensile stress in a range of about from about 1 MPa to about 20 MPa, such as about 1.5 to about 20 MPa, about 2 MPa to about 20 MPa, about 3 MPa to about 20 MPa, about 4 MPa to about 20 MPa, about 5 MPa to about 20 MPa, about 6 MPa to about 20 MPa, about 7 MPa to about 20 MPa, about 8 MPa to about 20 MPa, about 9 MPa to about 20 MPa, about 10 MPa to about 20 MPa, about 11 MPa to about 20 MPa, about 12 MPa to about 20 MPa, about 13 MPa to about 20 MPa, about 14 MPa to about 20 MPa, about 15 MPa to about 20 MPa, about 1 MPa to about 15 MPa, about 1.5 to about 15 MPa, about 2 MPa to about 15 MPa, about 3 MPa to about 15 MPa, about 4 MPa to about 15 MPa, about 5 MPa to about 15 MPa, about 6 MPa to about 15 MPa, about 7 MPa to about 15 MPa, about 8 MPa to about 15 MPa, about 9 MPa to about 15 MPa, about 10 MPa to about 15 MPa, about 11 MPa to about 15 MPa, about 12 MPa to about 15 MPa, about 1 MPa to about 10 MPa, about 1.5 to about 10 MPa, about 2 MPa to about 10 MPa, about 3 MPa to about 10 MPa, about 4 MPa to about 10 MPa, about 5 MPa to about 10 MPa, about 6 MPa to about 10 MPa, about 7 MPa to about 10 MPa, about 8 MPa to about 10 MPa, or any sub-ranges contained therein.

In a second embodiment, the glass-based article of the first embodiment is thermally strengthened.

In a third embodiment, the glass-based article of the first embodiment is chemically strengthened.

In a fourth embodiment, the glass-based article of any of the first through third embodiments has a parabolic stress profile.

In a fifth embodiment, in any of the first through fourth embodiments, the compressive stress at at least one of the first surface and the second surface is in a range of from about 150 MPa to about 800 MPa, such as from about 150 MPa to about 700 MPa, from about 150 MPa to about 600 MPa, from about 150 MPa to about 500 MPa, from about 200 MPa to about 800 MPa, from about 200 MPa to about 700 MPa, from about 200 MPa to about 600 MPa, from about 200 MPa to about 500 MPa, from about 250 MPa to about 800 MPa, from about 250 MPa to about 700 MPa, from about 250 MPa to about 600 MPa, from about 250 MPa to about 500 MPa, from about 300 MPa to about 800 MPa, from about 300 MPa to about 700 MPa, from about 300 MPa to about 600 MPa, from about 300 MPa to about 500 MPa, or any sub-ranges contained therein.

In a sixth embodiment, in the glass-based article of the fifth embodiment, the compressive stress at at least one of the first surface and the second surface is in the range of from about 300 MPa to about 600 MPa.

In a seventh embodiment, the glass-based article of any of the first through sixth embodiments comprises an alkali aluminosilicate glass.

In an eighth embodiment, the strengthened glass-based article of any of the first through seventh embodiments comprises a lithium aluminosilicate glass.

In a ninth embodiment, the strengthened glass-based article of any of the first through eighth embodiments is formed from a composition including $Li_2O$ in a range of from 0.1 mol % to 20 mol %.

In a tenth embodiment, the strengthened glass-based article of any of the first through ninth embodiments is formed from a composition including: from about 58 mol % to about 65 mol % $SiO_2$; from about 11 mol % to about 19 mol % $Al_2O_3$; from about 0.5 mol % to about 3 mol % $P_2O_5$; from about 6 mol % to about 18 mol % $Na_2O$; from 0 mol % to about 6 mol % MgO; and from 0 mol % to about 6 mol % ZnO.

In an eleventh embodiment, the strengthened glass-based article of any of the first through ninth embodiments is formed from a composition including from about 63 mol % to about 65 mol % $SiO_2$; from 11 mol % to about 17 mol % $Al_2O_3$; from about 1 mol % to about 3 mol % $P_2O_5$; from about 9 mol % to about 20 mol % $Na_2O$; from 0 mol % to about 6 mol % MgO; and from 0 mol % to about 6 mol % ZnO.

In a twelfth embodiment, the glass based article of the eleventh embodiment is formed from a composition wherein $R_2O$ (mol %)/$Al_2O_3$ (mol %)<2, where $R_2O=Li_2O+Na_2O$.

In a thirteenth embodiment, the glass based article of the eleventh embodiment is formed from a composition wherein 65 mol %<$SiO_2$ (mol %)+$P_2O_5$ (mol %)<67 mol %. and $R_2O$ (mol %)+R'O (mol %)-$Al_2O_3$ (mol %)+$P_2O_5$ (mol %)>−3 mol %, where $R_2O=Li_2O+Na_2O$ and R'O is the total amount of divalent metal oxides present in the composition.

A fourteenth embodiment provides a consumer electronic device comprising: a housing; electrical components provided at least partially internal to the housing, the electrical components including at least a controller, a memory, and a display, the display being provided at or adjacent to a front surface of the housing; and a cover article disposed at or over the front surface of the housing and over the display, wherein the cover article or housing comprises the glass-based article of any of the first through thirteenth embodiments.

In a fifteenth embodiment, the fourteenth embodiment is such that the device is a wearable electronic device configured to be worn on an individual, the wearable electronic device being selected from the group consisting of a watch, a media player, a wallet, and a bracelet.

A sixteenth embodiment pertains to a wearable consumer electronic device comprising a housing; electrical components provided at least partially internal to the housing, the electrical components including at least a controller, a memory, and a display, the display being provided at or adjacent to a front surface of the housing; and a cover disposed at or over the front surface of the housing and over the display, wherein the cover comprises a glass-based article having a thickness in a range of from about 0.2 mm to about 4.0 mm; a first compressive stress layer extending from a first surface of the glass-based article to a first depth of compression (DOC1) that is in a range of from about 5% to about 20% of the thickness; a second compressive stress layer extending from a second surface of the glass-based article to a second depth of compression (DOC2) that is in a range of from about 5% to about 20% of the thickness, wherein the second surface is opposite the first surface; and a central region extending from the first depth of compression (DOC1) to the second depth of compression (DOC2) and having a maximum tensile stress in a range of from about 0.5 MPa to about 20 MPa, wherein the glass-based article comprises chemically strengthened lithium aluminosilicate glass, wherein the wearable consumer electronic device is configured to be worn on an individual, the wearable electronic device selected from the group consisting of as a watch, a media player, a wallet and a bracelet.

In a seventeenth embodiment, the sixteenth embodiment is provided wherein the glass-based article is formed from a composition including from about 58 mol % to about 65 mol % $SiO_2$; from about 11 mol % to about 19 mol % $Al_2O_3$; from about 0.5 mol % to about 3 mol % $P_2O_5$; from about 6 mol % to about 18 mol % $Na_2O$; from 0 mol % to about 6 mol % MgO; and from 0 mol % to about 6 mol % ZnO.

Another aspect of this disclosure pertains to method of making a glass-based article. In an eighteenth embodiment, a method comprises strengthening a glass-based substrate to provide a glass-based article having a thickness in a range of from about 0.2 mm to about 2.0 mm to provide a first compressive stress layer extending from a first surface of the glass-based article to a first depth of compression (DOC1) that is in a range of from about 5% to about 20% of the thickness, a second compressive stress layer extending from a second surface of the glass-based article to a second depth of compression (DOC2) that is in a range of from about 5% to about 20% of the thickness, wherein the second surface is opposite the first surface; and continuing the strengthening until a central region of the glass-based article extending from the first depth of compression (DOC1) to the second depth of compression (DOC2) has a tensile stress in a range of from about 0.5 MPa to about 20 MPa.

The eighteenth embodiment can be modified so that the thickness can be in a range of from about 0.2 mm to about 3.5 mm, such as about 0.2 mm to about 3.0 mm, about 0.2 mm to about 2.5 mm, about 0.2 mm to about 2.0 mm, about 0.2 mm to about 1.5 mm, about 0.2 mm to about 1.0 mm, about 0.3 to about 4.0 mm, about 0.3 mm to about 3.5 mm, about 0.3 mm to about 3.0 mm, about 0.3 mm to about 2.5 mm, about 0.3 mm to about 2.0 mm, about 0.3 mm to about 1.5 mm, about 0.3 mm to about 1.0 mm, about 0.4 to about 4.0 mm, about 0.4 mm to about 3.5 mm, about 0.4 mm to about 3.0 mm, about 0.4 mm to about 2.5 mm, about 0.4 mm to about 2.0 mm, about 0.4 mm to about 1.5 mm, about 0.4 mm to about 1.0 mm, about 0.5 to about 4.0 mm, about 0.5 mm to about 3.5 mm, about 0.5 mm to about 3.0 mm, about 0.5 mm to about 2.5 mm, about 0.5 mm to about 2.0 mm, about 0.5 mm to about 1.5 mm, about 0.5 mm to about 1.0 mm, or any sub-ranges contained therein.

The eighteenth embodiment can be modified so that the first depth of compression (DOC1) and/or the second depth of compression (DOC2) is in a range of from about 6% to about 20% of the thickness, such as about 6% to about 20%, about 8% to about 20%, about 9% to about 20%, about 10% to about 20%, about 11% to about 20%, about 12% to about 20%, about 13% to about 20%, about 14% to about 20%, about 15% to about 20%, about 16% to about 20%, about 17% to about 20%, or any sub-ranges contained therein.

The eighteenth embodiment can be modified so that the central region has a maximum tensile stress in a range of about from about 1 MPa to about 20 MPa, such as about 1.5 to about 20 MPa, about 2 MPa to about 20 MPa, about 3 MPa to about 20 MPa, about 4 MPa to about 20 MPa, about 5 MPa to about 20 MPa, about 6 MPa to about 20 MPa, about 7 MPa to about 20 MPa, about 8 MPa to about 20 MPa, about 9 MPa to about 20 MPa, about 10 MPa to about 20 MPa, about 11 MPa to about 20 MPa, about 12 MPa to about 20 MPa, about 13 MPa to about 20 MPa, about 14 MPa to about 20 MPa, about 15 MPa to about 20 MPa, about 1 MPa to about 15 MPa, about 1.5 to about 15 MPa, about 2 MPa to about 15 MPa, about 3 MPa to about 15 MPa, about 4 MPa to about 15 MPa, about 5 MPa to about 15 MPa, about 6 MPa to about 15 MPa, about 7 MPa to about 15 MPa, about 8 MPa to about 15 MPa, about 9 MPa to about 15 MPa, about 10 MPa to about 15 MPa, about 11 MPa to about 15 MPa, about 12 MPa to about 15 MPa, about 1 MPa to about 10 MPa, about 1.5 to about 10 MPa, about 2 MPa to about 10 MPa, about 3 MPa to about 10 MPa, about 4 MPa to about 10 MPa, about 5 MPa to about 10 MPa, about 6 MPa to about 10 MPa, about 7 MPa to about 10 MPa, about 8 MPa to about 10 MPa, or any sub-ranges contained therein.

In a nineteenth embodiment, the strengthening of the eighteenth embodiment comprises thermal strengthening.

In a twentieth embodiment, the strengthening of the eighteenth embodiment comprises chemical strengthening.

In a twenty-first embodiment, the strengthening in any of the eighteenth through the twentieth embodiments provides a parabolic stress profile.

In a twenty-second embodiment, the strengthening of any of the eighteenth through twenty-first embodiments provides a compressive stress at at least one of the first surface and the second surface in a range of from about 150 MPa to about 800 MPa, such as from about 150 MPa to about 700 MPa, from about 150 MPa to about 600 MPa, from about 150 MPa to about 500 MPa, from about 200 MPa to about 800 MPa, from about 200 MPa to about 700 MPa, from about 200 MPa to about 600 MPa, from about 200 MPa to about 500 MPa, from about 250 MPa to about 800 MPa, from about 250 MPa to about 700 MPa, from about 250 MPa to about 600 MPa, from about 250 MPa to about 500 MPa, from about 300 MPa to about 800 MPa, from about 300 MPa to about 700 MPa, from about 300 MPa to about 600 MPa, from about 300 MPa to about 500 MPa, or any sub-ranges contained therein.

In a twenty-third embodiment, the glass-based article in any of the eighteenth through twenty-second embodiments comprises an alkali aluminosilicate glass.

In a twenty-fourth embodiment, the twenty-third embodiment further comprises exchanging ions with the alkali aluminosilicate glass.

In a twenty-fifth embodiment, the glass-based substrate of any of the eighteenth through twenty-fourth embodiments comprises a lithium aluminosilicate glass.

In a twenty-sixth embodiment, $Li_2O$ is present in the glass-based substrate of the twenty-fifth embodiment, prior to strengthening, in a range of 0.1 mol % to 20 mol %.

In a twenty-seventh embodiment, the glass-based substrate of the twenty-sixth embodiment comprises, prior to strengthening, from about 58 mol % to about 65 mol % $SiO_2$; from about 11 mol % to about 19 mol % $Al_2O_3$; from about 0.5 mol % to about 3 mol % $P_2O_5$; from about 6 mol % to about 18 mol % Na$_2$O; from 0 mol % to about 6 mol % MgO; and from 0 mol % to about 6 mol % ZnO.

In a twenty-eighth embodiment, the glass-based substrate in any of the eighteenth through twenty-sixth embodiments comprises, prior to strengthening, from about 63 mol % to about 65 mol % SiO$_2$; from 11 mol % to about 17 mol % Al$_2$O$_3$; from about 1 mol % to about 3 mol % P$_2$O$_5$; from about 9 mol % to about 20 mol % Na$_2$O; from 0 mol % to about 6 mol % MgO; and from 0 mol % to about 6 mol % ZnO.

In a twenty-ninth embodiment, the twenty-eighth embodiment is such that prior to strengthening, R$_2$O (mol %)/Al$_2$O$_3$ (mol %)<2, where R$_2$O=Li$_2$O+Na$_2$O.

In a thirtieth embodiment, the twenty-ninth embodiment is such that prior to strengthening, 65 mol %<SiO$_2$ (mol %)+P$_2$O$_5$ (mol %)<67 mol %, and R$_2$O (mol %)+R'O (mol %)-Al$_2$O$_3$ (mol %)+P$_2$O$_5$ (mol %)>-3 mol %, where R$_2$O=Li$_2$O+Na$_2$O and R'O is the total amount of divalent metal oxides present in the composition.

EXAMPLES

Various embodiments will be further clarified by the following examples. In the Examples, prior to being strengthened, the Examples are referred to as "substrates". After being subjected to strengthening, the Examples are referred to as "articles" or "glass-based articles."

Three glass-based substrates were prepared, each having a nominal composition before ion exchange of about 63.60 mol % SiO$_2$, 15.67 mol % Al$_2$O$_3$, 6.24 mol % Li$_2$O, 10.81 mol % Na$_2$O, 1.16 mol % ZnO, 2.48 mol % P$_2$O$_5$, and 0.04 mol % SnO$_2$.

Sample A was not ion exchanged.

Sample B was ion-exchanged in 100% NaNO$_3$ for 48 hours at 420° C.

Sample C was ion-exchanged in 100% NaNO$_3$ for 48 hours at 420° C., and in a second ion-exchange, was ion-exchanged in 100% KNO$_3$ for 30 min (0.5 hours) at 390° C.

Stress at depths below the surface was measured at using a SCALP-5 measurement system from Glasstress (Estonia). Stress at the surface and the spike was measured via FSM-6000 LE where the fringes demonstrate a high degree of birefringence and stress. The depth of the spike was 8 um and the stress at the surface was CS=1001.1 MPa via this method for Sample C. FIG. 6 illustrates the compressive stress measured via the two different techniques for Sample C.

The CT was zero for sample A, and the CT was about 14 MPa for sample B. The CT of sample C was 21.6 MPa, and occurred at approximately the half-width of 400 um (800 um thick sample).

In some embodiments, the glass-based articles described herein may be described in terms of performance in an inverted ball on sandpaper (IBoS) test. The IBoS test is a dynamic component level test that mimics the dominant mechanism for failure due to damage introduction plus bending that typically occurs in glass-based articles that are used in mobile or hand held electronic devices. In the field, damage introduction occurs on the top surface of the glass-based article. Fracture initiates on the top surface of the glass-based article and damage either penetrates the glass-based article or the fracture propagates from bending on the top surface or from the interior portions of the glass-based article. The IBoS test is designed to simultaneously introduce damage to the surface of the glass and apply bending under dynamic load. In some instances, the glass-based article exhibits improved drop fracture performance when it includes a compressive stress than if the same glass-based article does not include a compressive stress.

Figure 7:
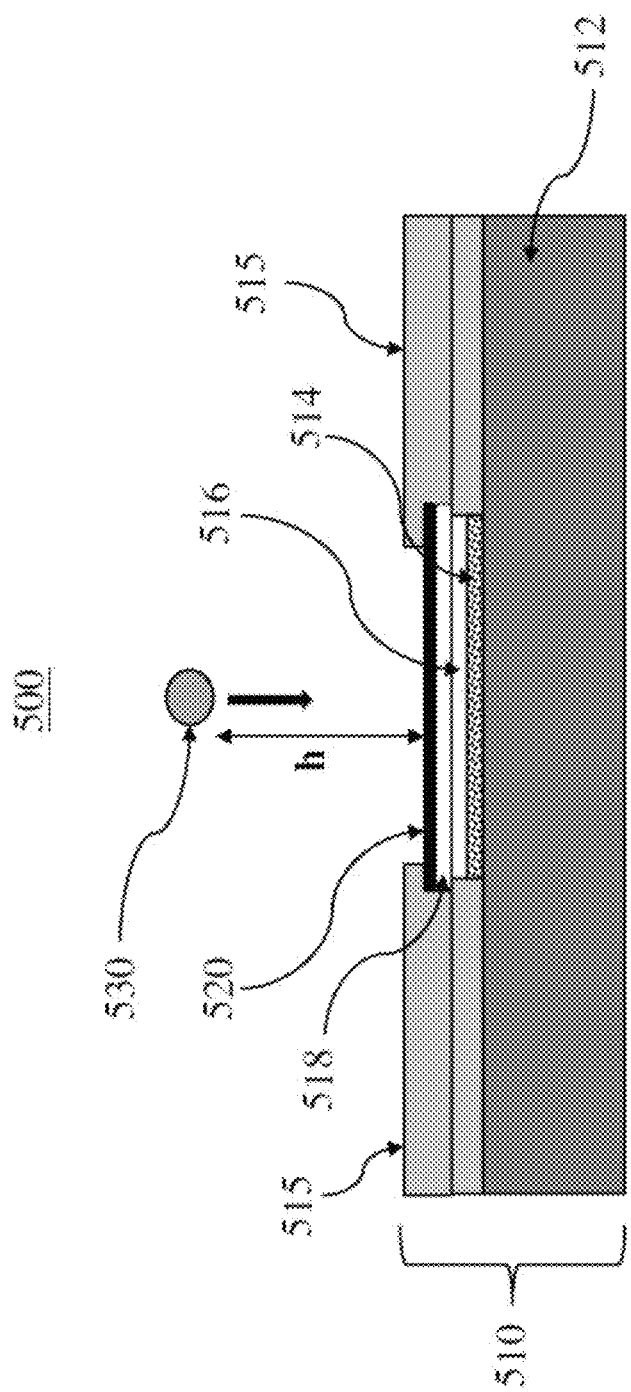
FIG. 7 is a schematic cross-sectional view of the apparatus that was used to perform the inverted ball on sandpaper (IBoS) test described herein.

An IBoS test apparatus is schematically shown in FIG. 7. Apparatus 500 includes a test stand 510 and a ball 530. Ball 530 is a rigid or solid ball such as, for example, a stainless steel ball, or the like. As tested, ball 530 was a 4.2 gram stainless steel ball having a diameter of 10 mm. The ball 530 was dropped directly onto the glass-based article sample 518 from a predetermined height h. Test stand 510 includes a solid base 512 comprising a hard, rigid material such as granite or the like. A sheet 514 having an abrasive material disposed on a surface is placed on the upper surface of the solid base 512 such that surface with the abrasive material faces upward. In some embodiments, sheet 514 is sandpaper having a 30 grit surface and, in other embodiments, a 180 grit surface. The glass-based article sample 518 is held in place above sheet 514 by sample holder 515 such that an air gap 516 exists between glass-based article sample 518 and sheet 514. The air gap 516 between sheet 514 and glass-based article sample 518 allows the glass-based article sample 518 to bend upon impact by ball 530 and onto the abrasive surface of sheet 514. In one embodiment, the glass-based article sample 518 is clamped across all corners to keep bending contained only to the point of ball impact and to ensure repeatability. In some embodiments, sample holder 515 and test stand 510 are adapted to accommodate sample thicknesses of up to about 2 mm. The air gap 516 is in a range from about 50 μm to about 100 μm. Air gap 516 is adapted to adjust for difference of material stiffness (Young's modulus). An adhesive tape 520 may be used to cover the upper surface of the glass-based article sample to collect fragments in the event of fracture of the glass-based article sample 518 upon impact of ball 530.

Various materials may be used as the abrasive surface. In a one particular embodiment, the abrasive surface is sandpaper, such as silicon carbide or alumina sandpaper, engineered sandpaper, or any abrasive material known to those skilled in the art for having comparable hardness and/or sharpness. The data in FIG. 8 was generated using 180 Grit sandpaper.

Figure 8:
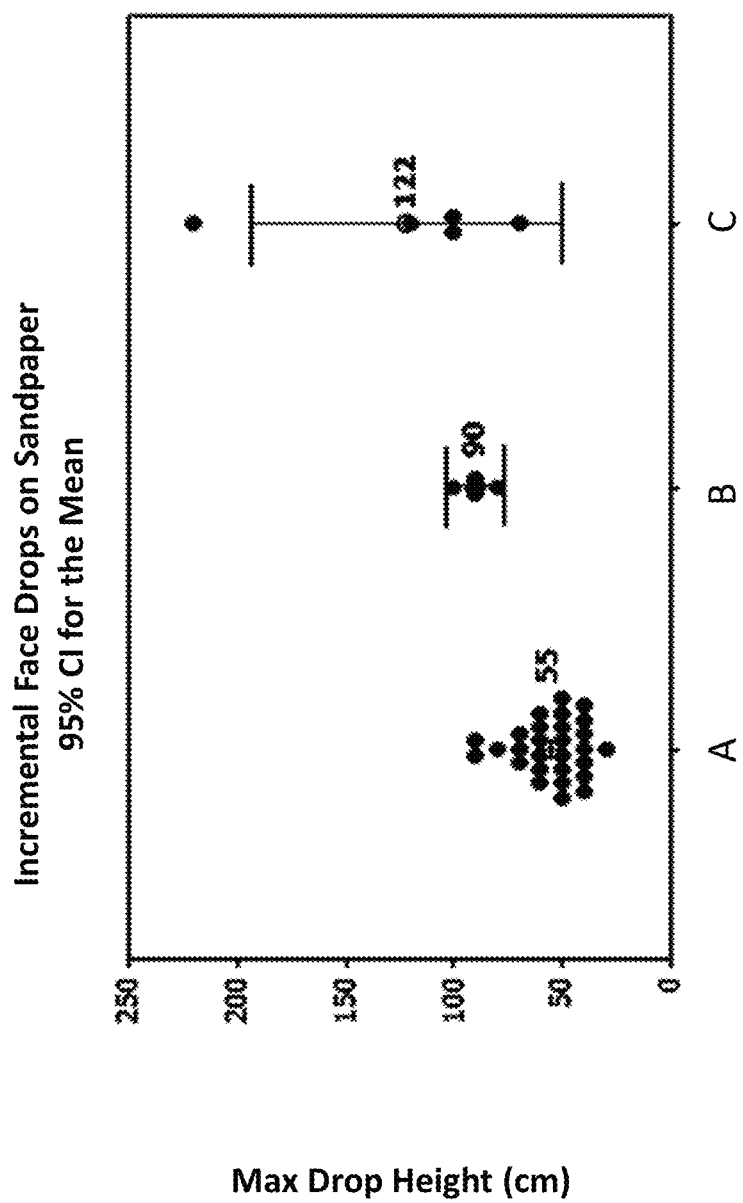
FIG. 8 is a graph showing max drop height data for Samples A, B and C described herein.

FIG. 8 is a plot of the drop height to failure for samples A, B and C. The results show an improvement in drop height due to the increase in compressive stress.

It will be apparent to those skilled in the art that various modifications and variations can be made without departing from the spirit or scope of the disclosure.

What is claimed is:

1. A glass-based article comprising:
   a thickness in a range of from greater than 0.5 mm to less than or equal to 2.0 mm;
   a first compressive stress layer extending from a first surface of the glass-based article to a first depth of compression (DOC1) that is in a range of from greater than or equal to 5% to less than or equal to 20% of the thickness;
   a second compressive stress layer extending from a second surface of the glass-based article to a second depth of compression (DOC2) that is in a range of from greater than or equal to 5% to less than or equal to 20% of the thickness, wherein the second surface is opposite the first surface;
   a first spike extending from the first surface of the glass-based article to a first spike depth (DOL1sp) that is less than DOC1;

a second spike extending from the second surface of the glass-based article to a second spike depth (DOL2sp) that is less than DOC2; and a central region extending from the first depth of compression (DOC1) to the second depth of compression (DOC2) and having a maximum tensile stress in a range of from greater than or equal to 0.5 MPa to less than or equal to 20 Mpa, wherein there is a compressive stress at at least one of the first surface and the second surface of greater than or equal to 300 Mpa.

2. The glass-based article of claim 1, wherein the glass-based article is thermally strengthened.

3. The glass-based article of claim 1, wherein the glass-based article is chemically strengthened.

4. The glass-based article of claim 1, wherein the glass-based article has a parabolic stress profile.

5. The glass-based article of claim 1, wherein there is a compressive stress at at least one of the first surface and the second surface in a range of from greater than or equal to 300 Mpa to less than or equal to 800 Mpa.

6. The glass-based article of claim 1, wherein there is a compressive stress at at least one of the first surface and the second surface in a range of from greater than or equal to 300 Mpa to less than or equal to 600 Mpa.

7. The glass-based article of claim 1, wherein the glass-based article comprises an alkali aluminosilicate glass.

8. The glass-based article of claim 1, wherein the glass-based article comprises a lithium aluminosilicate glass.

9. The glass-based article of claim 1, wherein the glass-based article is formed from a composition comprising $Li_2O$ in a range of from 0.1 mol % to 20 mol %.

10. The glass-based article of claim 9, wherein the glass-based article is formed from a composition comprising:
from greater than or equal to 58 mol % to less than or equal to 65 mol % $SiO_2$;
from greater than or equal to 11 mol % to less than or equal to 19 mol % $Al_2O_3$;
from greater than or equal to 0.5 mol % to less than or equal to 3 mol % $P_2O_5$;
from greater than or equal to 6 mol % to less than or equal to 18 mol % $Na_2O$;
from 0 mol % to less than or equal to 6 mol % MgO; and
from 0 mol % to less than or equal to 6 mol % ZnO.

11. The glass-based article of claim 9, wherein the glass-based article is formed from a composition comprising:
from greater than or equal to 63 mol % to less than or equal to 65 mol % $SiO_2$;
from greater than or equal to 11 mol % to less than or equal to 17 mol % $Al_2O_3$;
from greater than or equal to 1 mol % to less than or equal to 3 mol % $P_2O_5$;
from greater than or equal to 9 mol % to less than or equal to 20 mol % $Na_2O$;
from 0 mol % to less than or equal to 6 mol % MgO; and
from 0 mol % to less than or equal to 6 mol % ZnO.

12. The glass-based article of claim 10, wherein the glass-based article is formed from a composition wherein $R_2O$(mol %)/$Al_2O_3$(mol %)<2, where $R_2O$=$Li_2O$+$Na_2O$.

13. The glass-based article of claim 10, wherein the glass-based article is formed from a composition wherein 65 mol % <$SiO_2$(mol %)+$P_2O_5$(mol %)<67 mol %, and $R_2O$ (mol %) +R'O(mol %)−$Al_2O_3$(mol %)+$P_2O_5$(mol %) >−3 mol %, where $R_2O$=$Li_2O$+$Na_2O$ and R'O is the total amount of divalent metal oxides present in the composition.

14. A consumer electronic device comprising:
a housing;
electrical components provided at least partially internal to the housing, the electrical components including at least a controller, a memory, and a display, the display being provided at or adjacent to a front surface of the housing; and
a cover article disposed at or over the front surface of the housing and over the display,
wherein at least a portion of one of the cover article and/or housing comprises the glass-based article of claim 1.

15. The consumer electronic device according to claim 14, wherein the device is a wearable electronic device selected from the group consisting of a watch, a media player, a wallet and a bracelet.

16. A wearable consumer electronic device comprising:
a housing;
electrical components provided at least partially internal to the housing, the electrical components including at least a controller, a memory, and a display, the display being provided at or adjacent to a front surface of the housing; and
a cover disposed at or over the front surface of the housing and over the display, wherein the cover comprises a glass-based article according to claim 1, the glass-based article further comprising chemically strengthened lithium aluminosilicate glass, wherein the wearable consumer electronic device is configured to be worn on an individual, the wearable consumer electronic device selected from the group consisting of as a watch, a media player, a wallet, and a bracelet.

17. The wearable consumer electronic device of claim 16, wherein the glass-based article is formed from a composition comprising:
from greater than or equal to 58 mol % to less than or equal to 65 mol % $SiO_2$;
from greater than or equal to 11 mol % to less than or equal to 19 mol % $Al_2O_3$;
from greater than or equal to 0.5 mol % to less than or equal to 3 mol % $P_2O_5$;
from greater than or equal to 6 mol % to less than or equal to 18 mol % $Na_2O$;
from 0 mol % to less than or equal to 6 mol % MgO; and
from 0 mol % to less than or equal to 6 mol % ZnO.

18. A method of making a glass-based article, comprising:
strengthening a glass-based substrate to provide the glass-based article having a thickness in a range of from greater than 0.5 mm to less than or equal to 2.0 mm, a first compressive stress layer extending from a first surface of the glass-based article to a first depth of compression (DOC1) that is in a range of from greater than or equal to 5% to less than or equal to 20% of the thickness, a second compressive stress layer extending from a second surface of the glass-based article to a second depth of compression (DOC2) that is in a range of from greater than or equal to 5% to less than or equal to 20% of the thickness, a first spike extending from the first surface of the glass-based article to a first spike depth (DOL1sp) that is less than DOC1, and a second spike extending from the second surface of the glass-based article to a second spike depth (DOL2sp) that is less than DOC2, wherein the second surface is opposite the first surface; and
continuing the strengthening until a central region of the glass-based article extending from the first depth of compression (DOC1) to the second depth of compression (DOC2) has a tensile stress in a range of from greater than or equal to 0.5 Mpa to less than or equal to 20 Mpa, wherein there is a compressive stress at at least one of the first surface and the second surface of greater than or equal to 300 Mpa.

19. The method of claim 18, wherein the strengthening comprises thermal strengthening.

20. The method of claim 18, wherein the strengthening comprises chemical strengthening.

21. The method of claim 18, wherein the strengthening provides a parabolic stress profile.

22. The method of claim 18, wherein the strengthening provides a compressive stress at at least one of the first surface and the second surface in a range of from less than or equal to 300 MPa to less than or equal to 800 MPa.

23. The method of claim 18, wherein the glass-based article comprises an alkali aluminosilicate glass.

24. The method of claim 23, wherein the strengthening comprises exchanging ions with the alkali aluminosilicate glass.

25. The method of claim 18, wherein the glass-based substrate comprises a lithium aluminosilicate glass.

26. The method of claim 25, wherein the glass-based substrate comprises $Li_2O$ in a range of 0.1 mol % to 20 mol % prior to the strengthening.

27. The method of claim 26, wherein the glass-based substrate, prior to the strengthening, comprises:
from greater than or equal to 58 mol % to less than or equal to 65 mol % $SiO_2$;
from greater than or equal to 11 mol % to less than or equal to 19 mol % $Al_2O_3$;
from greater than or equal to 0.5 mol % to less than or equal to 3 mol % $P_2O_5$;
from greater than or equal to 6 mol % to less than or equal to 18 mol % $Na_2O$;
from 0 mol % to less than or equal to 6 mol % MgO; and
from 0 mol % to less than or equal to 6 mol % ZnO.

28. The method of claim 26, wherein the glass-based substrate, prior to the strengthening, comprises:
from greater than or equal to 63 mol % to less than or equal to 65 mol % $SiO_2$;
from greater than or equal to 11 mol % to less than or equal to 17 mol % $Al_2O_3$;
from greater than or equal to 1 mol % to less than or equal to 3 mol % $P_2O_5$;
from greater than or equal to 9 mol % to less than or equal to 20 mol % $Na_2O$;
from 0 mol % to less than or equal to 6 mol % MgO; and
from 0 mol % to less than or equal to 6 mol % ZnO.

29. The method of claim 27, wherein the glass-based substrate exhibits $R_2O$(mol %)/$Al_2O_3$(mol %)<2 prior to the strengthening, where $R_2$)=$Li_2O+Na_2O$.

30. The method of claim 27, wherein the glass-based substrate exhibits 65 mol % <$SiO_2$(mol %)+$P_2O_5$(mol %)<67 mol %, and $R_2O$(mol %)+R'O(mol %)−$Al_2O_3$(mol %) +$P_2O_5$(mol %) >−3 mol % prior to the strengthening, where $R_2$)=$Li_2O+Na_2O$ and R'O is the total amount of divalent metal oxides present in the glass-based substrate.

* * * * *

UNITED STATES PATENT AND TRADEMARK OFFICE
CERTIFICATE OF CORRECTION

PATENT NO. : 11,523,527 B2
APPLICATION NO. : 16/146214
DATED : December 6, 2022
INVENTOR(S) : Kameron Isaiah Chambliss et al.

Page 1 of 1

It is certified that error appears in the above-identified patent and that said Letters Patent is hereby corrected as shown below:

In the Claims

In Column 24, Line 13, Claim 15, delete "wallet" and insert -- wallet, --.

In Column 26, Line 21, Claim 29, delete "$R_2$)" and insert -- $R_2O$ --.

In Column 26, Line 26, Claim 30, delete "$R_2$)" and insert -- $R_2O$ --.

Signed and Sealed this
Twenty-eighth Day of October, 2025

John A. Squires
*Director of the United States Patent and Trademark Office*